(12) United States Patent
Blankenship

(10) Patent No.: US 8,140,932 B2
(45) Date of Patent: Mar. 20, 2012

(54) DATA INTERLEAVING CIRCUIT AND METHOD FOR VECTORIZED TURBO DECODER

(75) Inventor: T. Keith Blankenship, Kildeer, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 1046 days.

(21) Appl. No.: 11/944,643

(22) Filed: Nov. 26, 2007

(65) Prior Publication Data

US 2009/0138668 A1  May 28, 2009

(51) Int. Cl.
*H03M 13/00* (2006.01)
*G11C 29/00* (2006.01)

(52) U.S. Cl. .................................. 714/755; 714/702

(58) Field of Classification Search .................. 714/755, 714/786, 702, 781, 757, 820, 795, 776, 756, 714/801; 375/262, 341
See application file for complete search history.

(56) References Cited

U.S. PATENT DOCUMENTS 5,638,533 A * 6/1997 Law .............................. 711/157
7,200,799 B2 * 4/2007 Wang et al. .................... 714/795
7,986,741 B2 * 7/2011 Tsai et al. ...................... 375/261

OTHER PUBLICATIONS

Moison B. et al.: Coded Modulation for Deep-Space Optical Channel: Serially Concatenated Pulse-Position Modulation, IPN Progress Report 42-161, May 15, 2005, pp. 1-25.

Rovini, Massimo et al.: VLSI Design of a High-Throughput Multi-Rate Decoder for Structured LDPC Codes, Proceedings of the 2005 8th Euromicro conference on Digital System Design (DSD'05), IEEE Computer Society, 0-769502433-8/05 2005, IEEE, pp. 1-8.
Takeshita, Oscar Y., "On Maximum Contention Free Interleavers and Permutation Polynomials Over Integer Rings", IEEE Transactions on Information Theory, vol. 52, No. 3, Mar. 2006, pp. 1249-1253.
Sun, J. et al.: "Iterleavers for Turbo Codes Using Permutation Polynomials Over Integer Rings," IEEE Transactions on Information Theory, vol. 51, No. 1, Jan. 2005, pp. 101-119.
Ryu, Jonghoon et al.: "On Quadratic Inverses for Quadratic Permutation Polynomials Over Integer Rings", IEEE Transactions on Information Theory, vol. 52, No. 3, Mar. 2006, pp. 1254-1260.

* cited by examiner

*Primary Examiner* — Phung M Chung

(57) ABSTRACT

A data interleaving circuit and method for interleaving a data block comprising M windows of W values include an index generator for generating an intra-window index w and an inter-window permutation vector $\underline{m}$ having M elements and an inter-window permutation circuit operable to receive M data values having intra-window index w from a memory and further operable to reorder the M data values in accordance with the inter-window permutation vector $\underline{m}$ and output the reordered data values. The index generator includes a recursion circuit that generates the intra-window index w and inter-window permutation vector $\underline{m}$ in accordance with a permutation polynomial. In one application, the reordered data values are passed to M parallel processors of a turbo decoder.

21 Claims, 13 Drawing Sheets

FIG. 10

| ADDRESS | | B bits | | |
|---|---|---|---|---|
| 0 | $\pi(0)$ | $\pi(W)$ | ••• | $\pi((M-1)W)$ |
| 1 | $\pi(1)$ | $\pi(W+1)$ | ••• | $\pi((M-1)W+1)$ |
| ⋮ | ⋮ | ⋮ | ⋮ | ⋮ |
| W-1 | $\pi(W-1)$ | $\pi(2W-1)$ | ••• | $\pi(MW-1)$ |

| ADDRESS | | B bits | | |
|---|---|---|---|---|
| 0 | 0 | W | ••• | (M-1)W |
| 1 | 1 | W+1 | ••• | (M-1)W+1 |
| ⋮ | ⋮ | ⋮ | ⋮ | ⋮ |
| W-1 | W-1 | 2W-1 | ••• | MW-1 |

502

DATA INTERLEAVING CIRCUIT AND METHOD FOR VECTORIZED TURBO DECODER

BACKGROUND

In communications systems, signals transmitted, wirelessly for example, may be subjected to fading, jamming, and other elements that may cause errors to be introduced in the signal. The coding of signals before transmission helps to overcome the effects of channel noise, fading, and jamming, by allowing errors introduced during the transmission to be detected and corrected when the signal is decoded at a receiver.

"Turbo codes" have been recognized as a breakthrough in coding schemes and provide powerful resistance to errors generated during transmission. They can be implemented as parallel concatenated convolutional codes (PCCC) or serial concatenated convolutional codes (SCCC). Turbo codes provide high coding gains and bit error rates as low as $10^{-7}$. Turbo codes provide outstanding error correction and so are very useful in applications where the signal-to-noise ratio (SNR) is generally low (e.g., wireless communications).

An example of a conventional turbo encoder is shown in FIG. 1. The turbo encoder 100 receives a signal 102 that is passed to a first recursive systematic convolutional (RSC) encoder 104 and, via an interleaver 106 to a second convolutional encoder 108. The two convolutional encoders provide the component codes of a turbo code. The interleaver 106 changes the order of the data stream before it is input to the second convolutional encoder and, because one data stream is interleaved, the resulting code has time-variant characteristics that provide for the high coding gains obtained from turbo coders. The encoded signal 110 is modulated and transmitted over a communication channel.

An example of a conventional turbo decoder is shown in FIG. 2. The turbo decoder 200 receives a demodulated signal 202 from a communication channel. The signal 202 is passed to a first soft-input, soft output (SISO) decoder 204 and, via an interleaver 206, to a second SISO decoder 208. The second SISO decoder 208 also receives a component of the signal 202. The output of the first SISO decoder 204 is passed via interleaver 210 to the second SISO decoder 208, and the output of the second SISO decoder is passed via a de-interleaver 212 to the first SISO decoder 204, so as to enable iterative decoding. In operation, an incoming block of data (also called a data frame) is processed once and then recirculated several times to achieve a desired coding gain. Although turbo codes exhibit high resistance to errors, they are not ideally suited for many practical applications because of an inordinately high latency that is a result of the turbo encoder's use of interleavers (which introduce delay) and the turbo decoder's iterative algorithm which is computationally complex. Turbo codes usually work with large block sizes (e.g., >5000 bits). The soft inputs for an entire block must be stored in a memory in order to facilitate the iterative decoding. In other words, the soft inputs will be repetitively used and updated in each decoding phase. As a result, turbo decoders are memory intensive, which may render them impractical or too expensive for some applications.

In general, latency of serial turbo decoders may be marginally improved by using specially designed high-speed hardware to implement the turbo decoders; however, only incremental improvement in latency is provided at the cost of increased expense and device complexity, in addition to increased power dissipation (which may be unacceptable in many low power wireless devices).

An alternative approach to overcoming the high latency of turbo decoding is to use parallel decoding architectures. Parallel decoding can greatly improve throughput and latency. Two basic parallel schemes are available. Parallelism may be achieved by decoding multiple received signals at the same time or by dividing a received signal block into sub-blocks and decoding the sub-blocks in parallel by multiple parallel processors. While throughput and latency may be reduced using parallel decoding, the large memory requirement is not. In addition, hardware complexity and cost also are increased. Therefore, parallel schemes that are memory efficient and hardware (or area) efficient are needed for practical implementation of turbo codes.

One problem with parallel operation is that of memory access. In particular, the presence of an interleaver means that memory must be addressed out-of-order by multiple parallel processors. Memory contentions arise when two or more processors require read or write access to the same memory on the same clock cycle. A certain class of contention-free (CF) interleavers eliminates memory contentions.

The quadratic permutation polynomial (QPP) turbo interleaver, which has been adopted in the Long Term Evolution (LTE) standard, is a CF interleaver. Due to the high data rates required in LTE systems, the turbo decoder will need to employ parallel decoding using multiple processors. Therefore, there is a need to apply the QPP to a multi-processor turbo decoder.

BRIEF DESCRIPTION OF THE FIGURES

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present invention.

FIGS. 10 and 11 show exemplary memory allocations in accordance with some embodiments of the invention.

Figure 1:
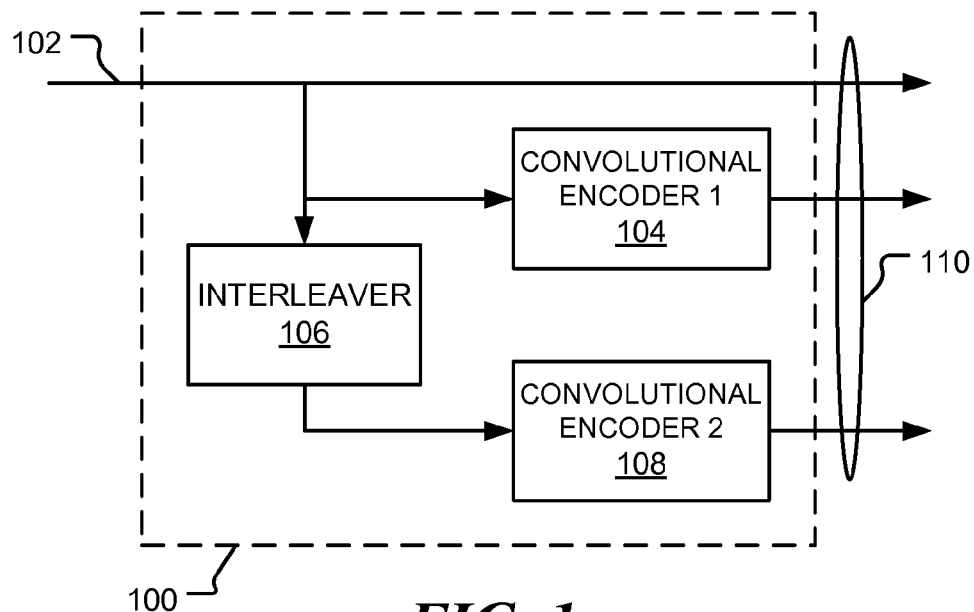
FIG. 1 is a block diagram of an exemplary conventional turbo encoder.
Figure 2:
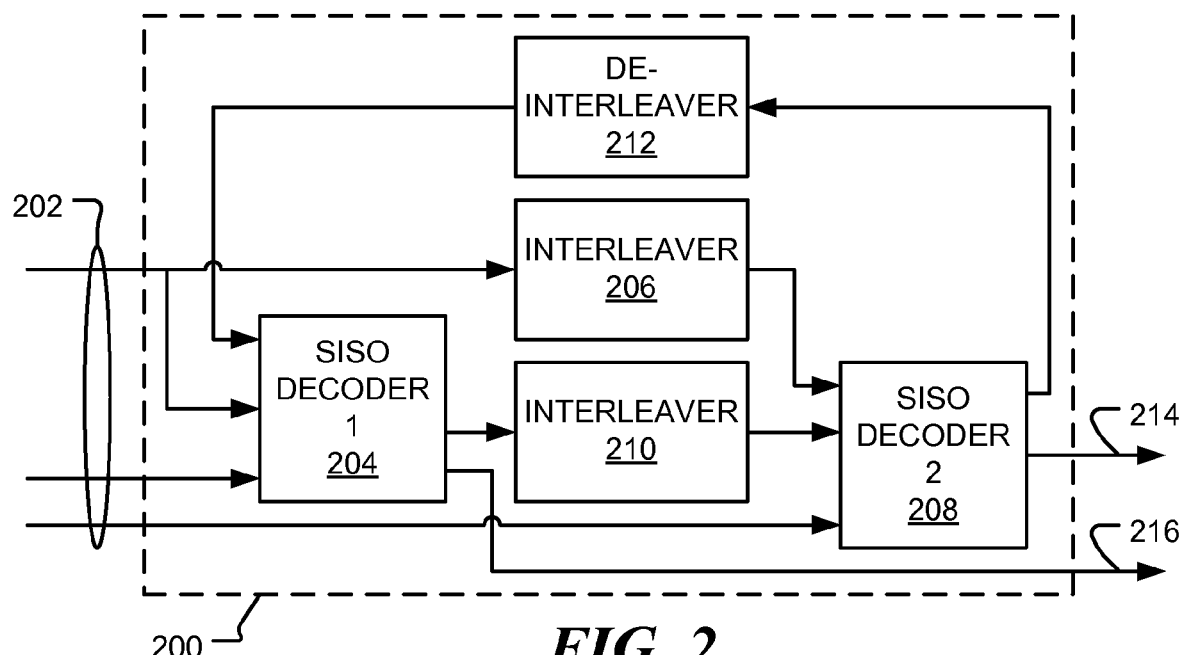
FIG. 2 is a block diagram of an exemplary conventional turbo decoder.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to interleavers in turbo decoders. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may comprise a programmable logic circuit, such as field programmable gate array (FPGA) or conventional processors with unique stored program instructions that control the one or processors to implement some, most, or all of the functions of interleaving described herein. Alternatively, some or all functions could be implemented by a state machine that has no stored program instructions, or in one or more application specific integrated circuits (ASICs), in which each function or some combinations of certain of the functions are implemented as custom logic. Of course, a combination of these approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Embodiments of the present invention relates to memory access in a parallel or vectorized turbo decoder. Accordingly, embodiments of the present invention relates generally to data processing circuits and in particular to data processing circuits for communication systems utilizing "turbo codes".

Figure 3:
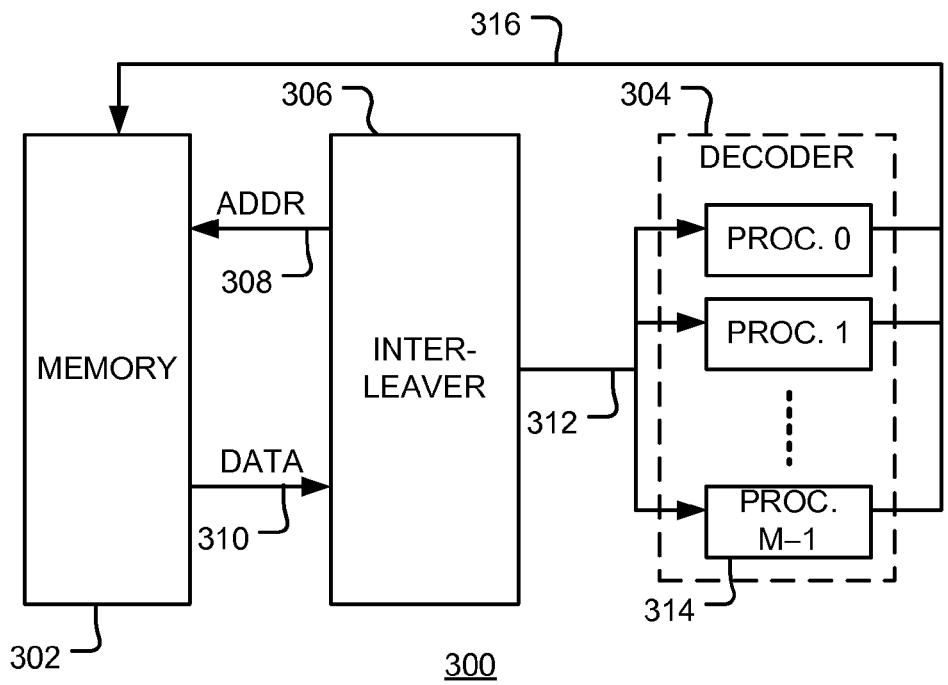
FIG. 3 is a block diagram of a portion of a decoder circuit in accordance with some embodiments of the invention.

FIG. 3 is a block diagram of a portion of a decoder circuit 300 in accordance with some embodiments of the invention. Referring to FIG. 3, the circuit 300 includes a data memory 302 that provides data storage for a decoder 304. An interleaver circuit 306 is operable to transfer data from the memory 302 to the decoder 304. The interleaver circuit 306 is a device that permutes a sequence of data according to a permutation defined by an ordered sequence of indices. In a typical application, such as turbo decoding, the interleaver generates addresses 308 for the random access of data in a memory and receives corresponding data 310 from the memory. Since the generated addresses typically correspond to the ordered sequence of indices, this document uses the terms "indices" and "addresses" interchangeably. The data 312, in natural or interleaved order, is passed to the decoder 304.

The decoder 304 is a parallel or vectorized processor comprising a number of processing elements 314 that operate in parallel to decode the data. Each processing element operates on a sub-section, sub-block, or "window" of a received block of data. The interleaver operates to permute the data from the memory between the windows. The term "vectorized" is used when the interleaver allows the data to be stored and fetched as vectors (i.e., as distinct groups). Data 316 outputted from the decoder may be stored in the memory 302 or outputted to other processing modules.

The interleaver 306 may be embodied in various vectorized turbo decoder architectures, and a design criterion is disclosed that simplifies the logic circuit for generating the sequence of inter-window permutations.

In one embodiment of the invention the interleaver is a quadratic permutation polynomial (QPP) interleaver in a vectorized turbo decoder. In this embodiment, the interleaver provides recursive generation of higher order permutation polynomials in either forward or reverse order. In one embodiment the interleaver is implemented as logic circuits to decompose, automatically, an address $\pi(x)=m_x W+w_x$ into its $m_x$ and $w_x$ components. In addition the interleaver may be used to generate "intra-window" addresses and "inter-window" permutations required for vectorized turbo decoding.

The interleaver may be used in turbo decoder hardware proposed for the long term evolution (LTE) of $3^{rd}$ generation (3G) radio access technology, referred to as "LTE" in the sequel.

The QPP permutation is the quadratic case of a permutation generated by a polynomial. An introductory treatment of permutation polynomials is described first. The treatment is generic because a turbo decoder can effectively use the inverse permutation which, although polynomial in form, is not necessarily quadratic. Next, exemplary vectorized turbo decoding architectures are described, from which interleaver functional requirements are deduced. One function of the interleaver is the decomposition of the permutation into "intra-window" addresses and "inter-window" permutations. A design criterion is also described that can simplify the generation of the sequence of inter-window permutations.

An n-th order permutation polynomial has the form $$P_n(x) = \sum_{i=0}^{n} f_i x^i \bmod K \quad (1)$$

where x and the $f_i$ are integers. As x is incremented from 0 through K−1, the polynomial $P_n(x)$ generates a permutation, which is typically interpreted as the pre-permuted position of the quantity at position x in the permuted sequence. Several constraints on the $f_i$, not covered here, ensure that $P_n(x)$ generates a permutation. In the case of LTE, the turbo interleaver uses a quadratic polynomial, i.e., n=2. For simplicity, the remainder of this document generally omits the mod K notation, implicitly assuming all quantities are reduced modulo K, unless otherwise noted.

The inverse permutation $P_m^{-1}(x)$, where $$P_m^{-1}(P_n(x)) = x \quad (2)$$

also has polynomial form:

$$P_m^{-1}(x) = \sum_{i=0}^{m} g_i x^i \quad (3)$$

In general, n≠m. For a QPP, $f_2$ must contain all prime factors of K to some order. As a result, m is no larger than the largest order of all the prime factors of $f_2$.

Decoder throughput can be increased through vectorization. In a vectorized decoder, a length-K block of data is divided into M typically non-overlapping length-W "windows", K=MW, that are processed synchronously by M processors.

Figure 4:
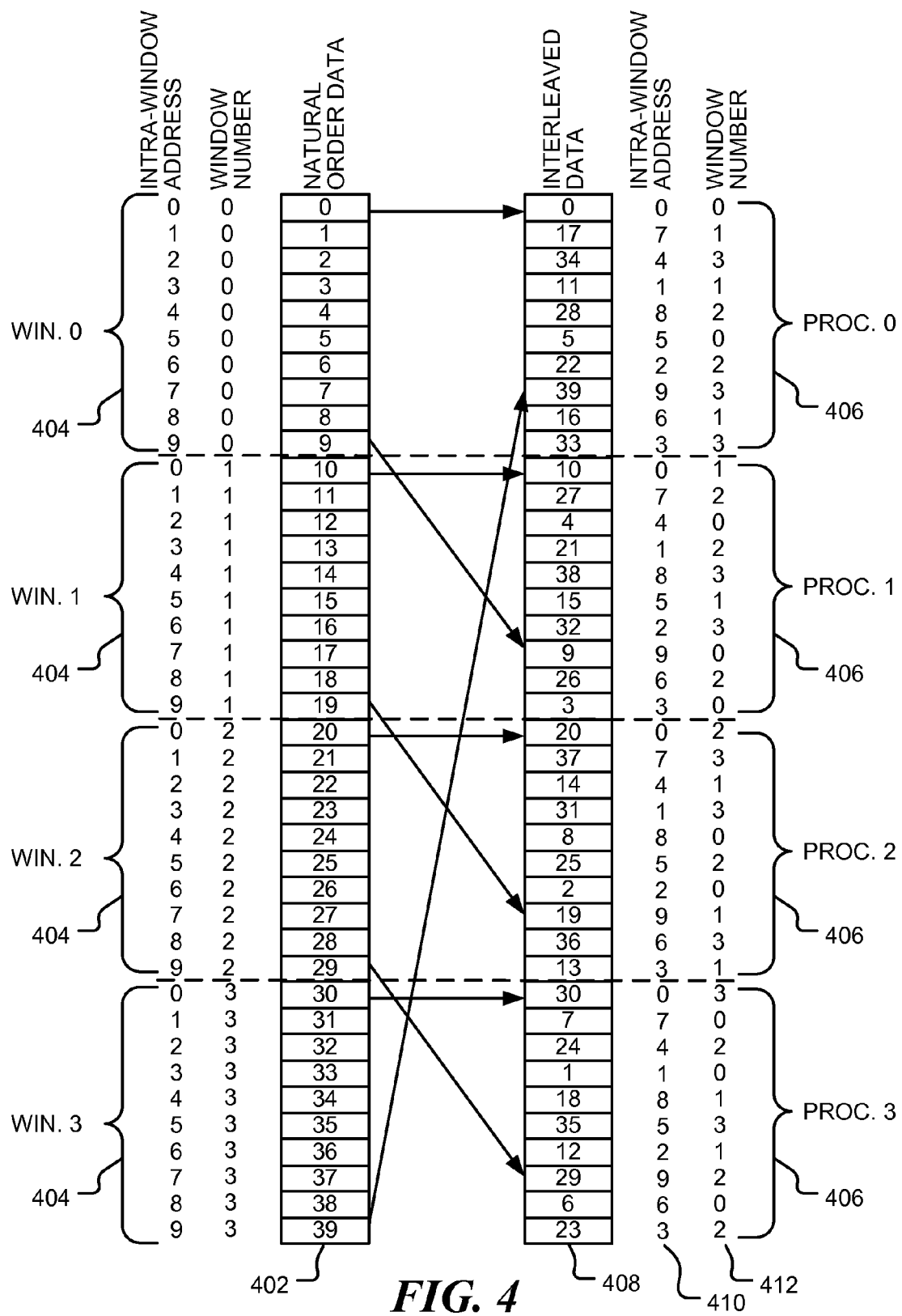
FIG. 4 shows an exemplary data permutation in accordance with some embodiments of the invention.

FIG. 4 shows an exemplary data permutation in accordance with some embodiments of the invention. FIG. 4 shows a block of data 402 with length K=40. The block 402 has been divided into M=4 length-10 windows, 404. The data is processed by 4 processors 406. The i-th processor, 0≤i≤3, processes data at positions 10i through 10i+9 in the data block 402.

Due to iterative processing, a turbo decoder should be capable of processing data both in sequential, or "natural", order and in a permuted order. In FIG. 4, the array 402 depicts a sequence of data in natural order and the array 408 depicts the sequence in permuted or interleaved order. FIG. 4 shows that processor 0 must be capable of sequentially processing data at positions 0, 1, 2, . . . , 9 and at positions 0, 17, 34, 11, 28, 5, 22, 39, 16, 33. Similarly, processor 1 must be capable of sequentially processing data at positions 10, 11, 12, . . . , 19 and at positions 10, 27, 4, 21, 38, 15, 32, 9, 26, 3.

The combination of vectorization and permuted order processing introduces a memory management problem, since multiple processors must simultaneously fetch data from memory in permuted order without interfering or contending with each other for memory access.

The permutation addresses in the "interleaved data" column of FIG. 4 are actually generated by the QPP $37x+20x^2$ mod 40. In FIG. 4 each natural order and each permutation address has been decomposed into the form m10+w, where w is in the "intra-window address" column and m is in the "window number" column. In the sequel, addresses are generally conceived of in the form mW+w, and m and w are referred to as the m and w components of the address, respectively. For the permutation addresses, the m component indicates the window in the pre-permuted sequence from which the data originates, and the w component indicates the relative position within the window from which the data originates.

The permutation address column 408 of FIG. 4 shows that at any given step all processors process data at the same intra-window address (column 410). For instance, for permuted order processing, on the first step all processors process data at intra-window address 0. On the second step, all processors process data at intra-window address 7. Furthermore, note that for permuted order processing there is an inter-window permutation on each step (column 412). Let $m_i=(m_0, m_1, m_2, m_3)_i$, $0 \leq m_0, m_1, m_2, m_3 \leq 3$, denote the m components of the permuted addresses for processors 0, 1, 2, and 3, respectively, on the i-th processing step, $0 \leq i \leq 9$. Each $m_i$ is an inter-window permutation for step i. Table 1 lists these inter-window permutations as a function of i. In passing, note that each $m_i$, $1 \leq i \leq 9$, is a cyclic shift of $m_0$. While this is not generally true of a permutation polynomial, the conditions the conditions under which the property holds are derived below.

TABLE 1

| i | $m_i$ |
|---|---|
| 0 | (0, 1, 2, 3) |
| 1 | (1, 2, 3, 0) |
| 2 | (3, 0, 1, 2) |
| 3 | (1, 2, 3, 0) |
| 4 | (2, 3, 0, 1) |
| 5 | (0, 1, 2, 3) |
| 6 | (2, 3, 0, 1) |
| 7 | (3, 0, 1, 2) |
| 8 | (1, 2, 3, 0) |
| 9 | (3, 0, 1, 2) |

As a result, the data in this example can be stored in a 10×4B memory, where B is the datum width in bits.

Figure 5:
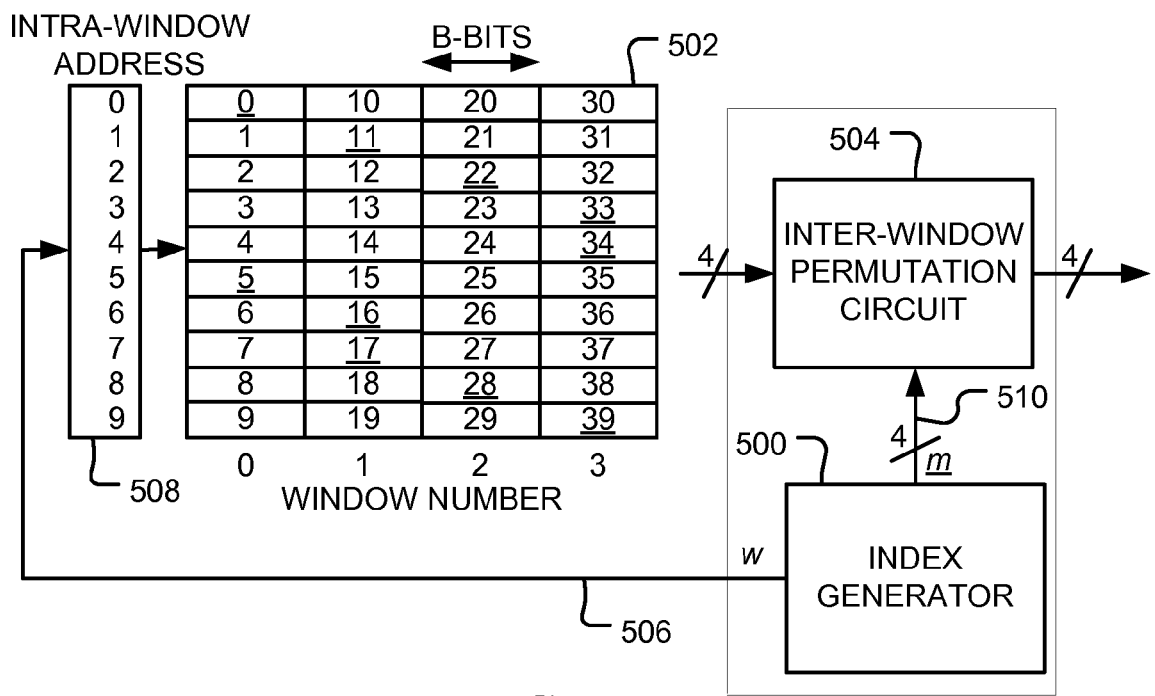
FIG. 5 is a block diagram of an exemplary interleaver in accordance with some embodiments of the invention.

FIG. 5 is a block diagram of an exemplary interleaver in accordance with some embodiments of the invention. Referring to FIG. 5, the interleaver includes an index generator 500, a memory 502 and an inter-window permutation circuit 504. The 10×4B memory 502 contains the 40 data samples of a block. Each row of the memory contains data elements having the same intra-window index, w, while each column contains data elements having the same window index, m. When processing the data in natural order, processor 0 processes the first column of data values. When processing the data in interleaved order, processor 0 processes the data values with underlined numerals in the intra-window order {0, 7, 4, 1, 8, 5, 2, 9, 6, 3}. In operation, the index generator 500 generates an intra-window index 506 (w) that is passed to a memory access controller 508. In this example, the memory access controller 508 comprises a row selector that causes the four data elements in the corresponding row of the memory 502 to be passed to the inter-window permutation circuit 504. The index generator 500 also generates a four-element permutation vector 510 (m) that is passed to the inter-window permutation circuit 504. The inter-window permutation circuit 504 permutes the order of the four data elements in accordance with the permutation vector and outputs the data in permuted order to the processing elements of the decoder.

To process the data in sequential order as vectors, the index generator issues the sequential intra-window address addresses {0, 1, 2, . . . , 9}, and an identity (i.e., pass through) inter-window permutation {0, 1, 2, 3} is applied. To vector process the data in permuted order, the index generator issues the addresses 0, 7, 4, 1, 8, 5, 2, 9, 6, 3 and the inter-window permutations in Table 1 are applied.

The previous example demonstrates that fetching data vectors for permuted order processing requires that at each step all processors process data at the same intra-window address. Mathematically, the vectorization criterion for a permutation $\pi(x)$ is thus $$\pi(uW+v) \bmod W = \pi(v) \bmod W \tag{4}$$

for all $1 \leq u \leq M-1$ and $0 \leq v \leq W-1$. A permutation that satisfies Equation (4) is referred to here as a vectorizable permutation.

Assuming that W factors K, it is straightforward to show that $P_n(x)$ is vectorizable as follows.

$$P_n(uW+v) \bmod W = \sum_{i=0}^{n} f_i (uW+v)^i \bmod K \bmod W \tag{5}$$

$$= \sum_{i=0}^{n} f_i \sum_{j=0}^{i} \binom{i}{j} v^j u^{i-j} W^{i-j} \bmod K \bmod W$$

$$= \sum_{i=0}^{n} f_i v^i \bmod K \bmod W +$$

$$\sum_{i=0}^{n} f_i \sum_{j=0}^{i-1} \binom{i}{j} v^j u^{i-j} W^{i-j} \bmod K \bmod W$$

$$= P_n(v) \bmod W +$$

$$\sum_{i=0}^{n} f_i \sum_{j=0}^{i-1} \binom{i}{j} v^j u^{i-j} W^{i-j} \bmod W$$

$$= P_n(v) \bmod W$$

Equations (5) use the relation $t \bmod K \bmod W = t \bmod W$ for any integer $t$ when W factors K. The double summation in the fourth equation of the five equations of Equations (5) is zero because each term in the summation contains at least one factor of W.

Since $P_m^{-1}(x)$ is polynomial in form like $P_n(x)$, it must also satisfy a vectorization criterion $$P_m^{-1}(uW+v) \bmod W = P_m^{-1}(v) \bmod W \tag{6}$$

for all $1 \leq u \leq M-1$ and $0 \leq v \leq W-1$. Since both $P_n(x)$ and $P_m^{-1}(x)$ are vectorizable, the data can be stored and fetched vectorially in either natural order or in interleaved order. As discussed below, this has an important simplifying impact on a vectorized turbo decoder.

Although Equation (6) relied on the polynomial form of $P_m^{-1}(x)$ to demonstrate vectorizability, it is generally true that if a permutation $\pi(x)$ is vectorizable then its inverse permutation $\pi^{-1}(x)$ is also vectorizable. Since $\pi(x)$ is vectorizable, it must be that $$\pi(uW+v) = m_u W + w_v \tag{7}$$

where $0 \leq u, m_u \leq M-1$ and $m_x \neq m_y$ for $x \neq y$ and $0 \leq v, w_v \leq W-1$.

Taking the inverse of Equation (7), $$\pi^{-1}(m_u W + w_v) = uW + v \tag{8}$$

Given Equation (8), $\pi^{-1}(x)$ clearly satisfies the vectorization criterion of Equation (4).

The engineering literature recites a contention-free criterion for a permutation $\pi(x)$ of length $K=MW$ as $$\left\lfloor \frac{\pi(x+pW)}{W} \right\rfloor \neq \left\lfloor \frac{\pi(x+qW)}{W} \right\rfloor \tag{9}$$

for all $0 \leq p,q \leq M-1$ such that $p \neq q$. Because $P_n(x)$ satisfies the vectorization criterion of Equation (4) it must be that $$P_n(uW+v) = m_u W + w_v \tag{10}$$

where $0 \leq m_u \leq M-1$ with $m_x \neq m_y$ for $x \neq y$ and $0 \leq w_v \leq W-1$ with $w_x \neq w_y$ for $x \neq y$.

Since the floor operation of Equation (9) extracts $m_u$, $P_n(x)$ must therefore satisfy Inequality (9). Identical reasoning dictates that because Equation (6) is satisfied $P_m^{-1}(x)$ must also satisfy Inequality (9).

However, consider permutations of the form $$\pi(uW+v) = m_u W + w_{u,v} \tag{11}$$

where $0 \leq m \leq M-1$ with $m_x \neq m_y$ for $x \neq y$ and $0 \leq w_{u,v} \leq W-1$. Here the w component depends on both u and v not on v alone as in Equation (10). Then Inequality (9) is satisfied, but the vectorization criterion would not necessarily be satisfied. Therefore, the vectorization criterion is a stronger criterion for vectorized turbo decoding. In addition to guaranteeing contention-free memory access, it also allows the data to be stored and fetched as vectors by issuing a desired intra-window address.

Hardware turbo decoding requires a means of generating $P_n(x)$ recursively. A recursion relation can be derived by expanding $P_n(x+1)$ as follows, $$P_n(x+1) = \sum_{i=0}^{n} f_i(x+1)^i \tag{12}$$

$$= \sum_{i=0}^{n} \sum_{j=0}^{i} f_i \binom{i}{j} x^j$$

$$= \sum_{i=0}^{n} f_i x^i + \sum_{i=0}^{n} \sum_{j=0}^{i-1} f_i \binom{i}{j} x^j$$

$$= \sum_{i=0}^{n} f_i x^i + \sum_{i=0}^{n-1} \left( \sum_{j=i+1}^{n} f_j \binom{j}{i} \right) x^i$$

$$= P_n(x) + P_{n-1}^n(x)$$

where $P_{n-1}^n(x)$ is an order n−1 polynomial $$P_{n-1}^n(x) = \sum_{i=0}^{n-1} h_{n-1,i} x^i \tag{13}$$

with coefficients $$h_{n-1,i} = \sum_{j=i+1}^{n} f_j \binom{j}{i}. \tag{14}$$

Since $P_{n-1}^n(x)$ is itself a polynomial, we have $$P_{n-1}^n(x) = P_{n-1}^n(x-1) + P_{n-2}^{n-1}(x-1) \tag{15}$$

The recursion relation of Equations (12) can therefore be regressed back to the order-0 term as follows.

$$P_n(x+1) = P_n(x) + \sum_{i=0}^{n-1} P_{n-i-1}^{n-i}(x-i). \quad (16)$$

Figure 6:
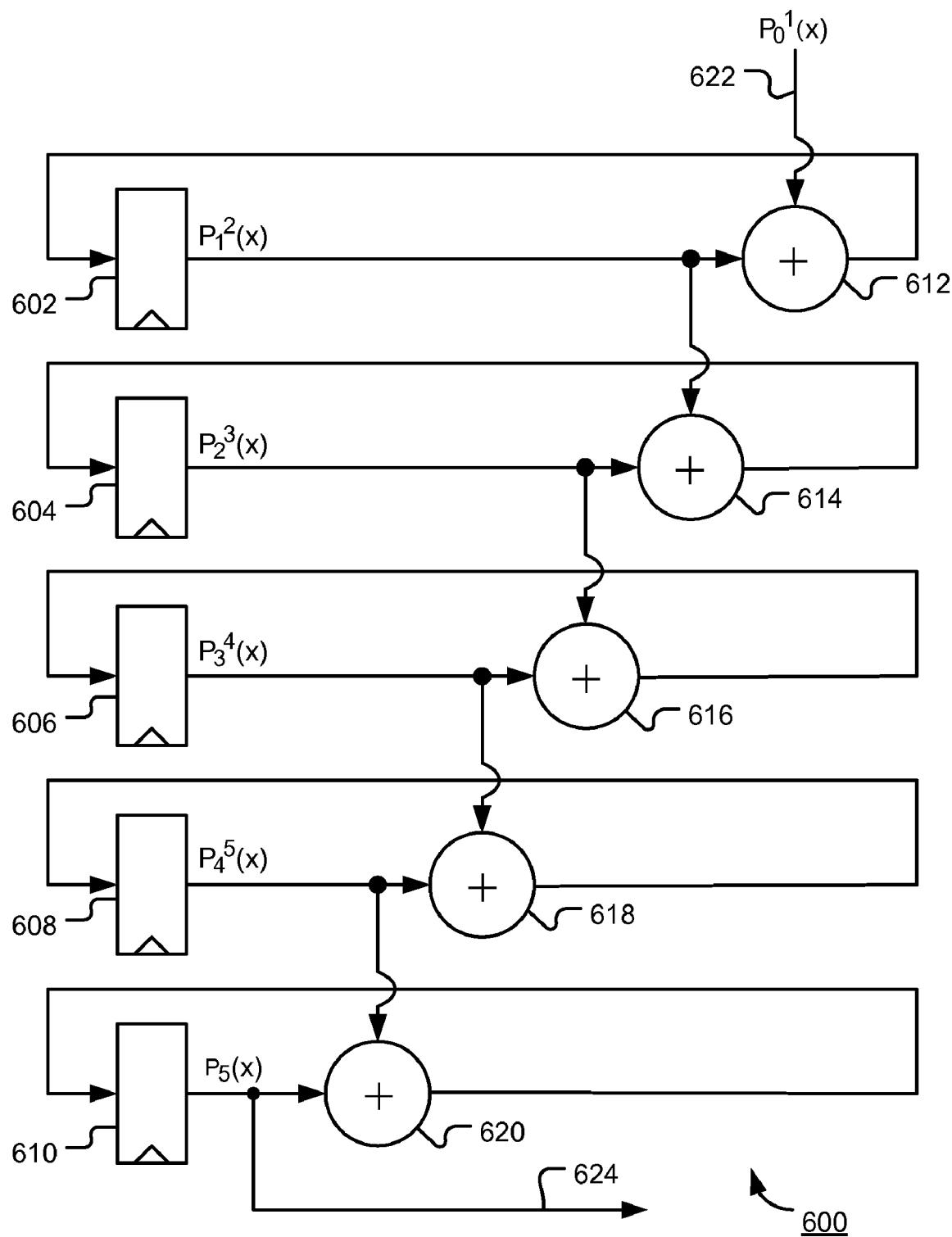
FIG. 6 is a block diagram of an exemplary polynomial recursion circuit in accordance with some embodiments of the invention.

Equation (16) has a straightforward hardware implementation, an example of which is shown in FIG. 6 for n=5. In FIG. 6, the recursion circuit 600 includes registers 602, 604, 606, 608 and 610 and adders 612, 614, 616, 618 and 620. The input signal $P_0^1(x)$ (622) is a constant and the initial value of each $P_{i-1}^i(x)$ register, $1 \leq i \leq 5$, is the constant term $h_{i-1,0}$ of Equation (13). The initialization values $h_{i-1,0}$ may be determined, for example, by computing the initialization values in real time or pre-computing and storing the values in a read-only memory. The output 624 is the polynomial value $P_n(x)$. The hardware in FIG. 6 can also compute $P_n(x)$ for any n<5 by initializing $P_{i-1}^i(x)$ to 0 for $1 \leq i \leq 5-n$.

Figure 7:
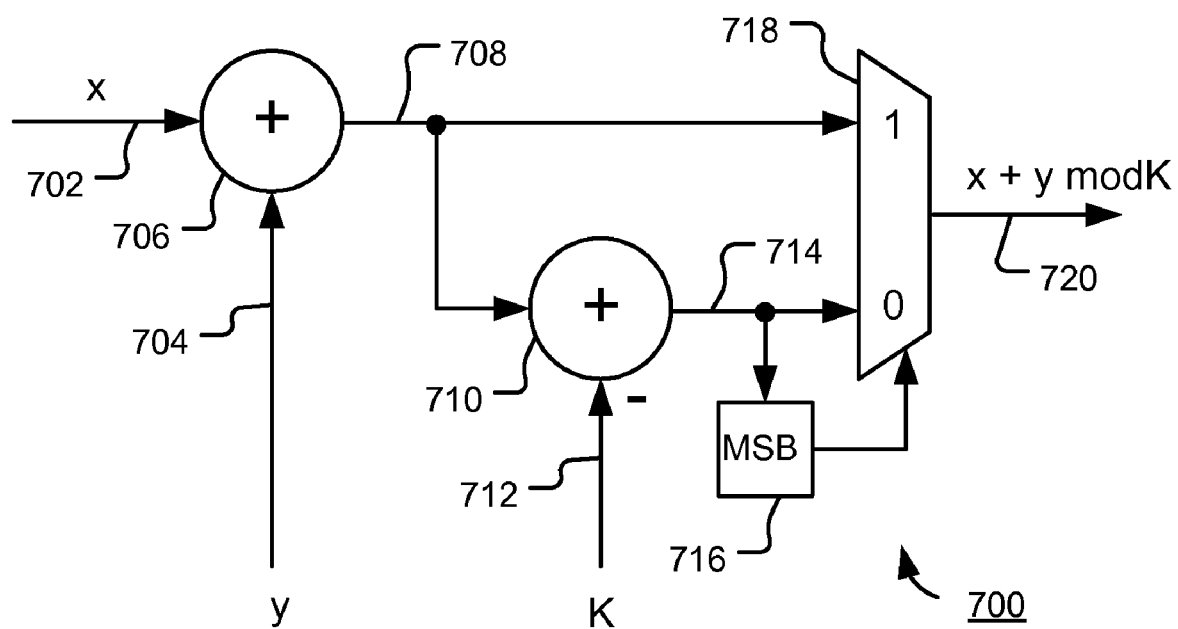
FIG. 7 is a block diagram of an exemplary renormalizable adder in accordance with some embodiments of the invention.

The hardware model in FIG. 6 has been simplified by omitting the reduction modulo K of the signals that occurs in practice. This could be accomplished by using a renormalizable adder 700 shown in FIG. 7 in place of each of the adders of FIG. 6. Referring to FIG. 7, the renormalizable adder 700 is operable to add the input signals 702 (x) and 704 (y), modulo K. Input signals x and y are added in adder 706 to produce signal 708. At adder 710, the value K (712) is subtracted from the signal 708 to produce the signal 714. If the signal 714 is positive, it should be used as the output. If the signal 714 is negative, the signal 708 should be used as the output. In this example, data is stored in 2's complement form, so the most significant bit (MSB) of the signal 714 can be selected at 716 and used to control a signal selector 718. The result of the addition, modulo K, is output as signal 720.

The hardware in FIG. 6 generates $P_n(x)$ starting at x=0 and increasing up through x=K−1. However, a turbo decoder also needs to generate $P_n(x)$ in reverse order, i.e., starting at x=K−1 and decreasing down through x=0. A recursion relation can be derived by expanding $P_n(x-1)$ as follows.

$$P_n(x-1) = \sum_{i=0}^{n} f_i(x-1)^i \quad (17)$$

$$= \sum_{i=0}^{n} \sum_{j=0}^{i} f_i \binom{i}{j}(-1)^{i-j} x^j$$

$$= \sum_{i=0}^{n} f_i x^i + \sum_{i=0}^{n} \sum_{j=0}^{i-1} f_i \binom{i}{j}(-1)^{i-j} x^j$$

$$= \sum_{i=0}^{n} f_i x^i + \sum_{i=0}^{n-1} \left( \sum_{j=i+1}^{n} f_j (-1)^{j-i} \binom{j}{i} \right) x^i$$

$$= P_n(x) + Q_{n-1}^n(x)$$

where $Q_{n-1}^n(x)$ is an order n−1 polynomial $$Q_{n-1}^n(x) = \sum_{i=0}^{n-1} k_{n-1,i} x^i \quad (18)$$

with coefficients $$k_{n-1,i} = \sum_{j=i+1}^{n} f_j (-1)^{j-i} \binom{j}{i}. \quad (19)$$

Since $Q_{n-1}^n(x)$ is itself a polynomial, we have $$Q_{n-1}^n(x) = Q_{n-1}^n(x+1) + Q_{n-2}^{n-1}(x+1) \quad (20)$$

The recursion relation of Equation (20) can therefore be regressed back to the order-0 term as follows.

$$P_n(x-1) = P_n(x) + \sum_{i=0}^{n-1} Q_{n-i-1}^{n-i}(x+i) \quad (21)$$

By initializing value of the $P_{i-1}^i(x)$ register, $1 \leq i \leq 5$, to the constant term $k_{i-1,0}$ the hardware of FIG. 6 can be used to compute the recursion of Equation (21). As for register initialization for forward order generation, the initialization values $k_{i-1,0}$ may be determined, for example, by computing the initialization values in real time or pre-computing and storing the values in a read-only memory As an example of the concepts, consider the permutation polynomial $$P_3(x) = 37x + 20x^2 + 10x^3 \bmod 40 \quad (22)$$

Using the equations above, $$P_2^3(x) = \left[ 37\binom{1}{0} + 20\binom{2}{0} + 10\binom{3}{0} \right] + \quad (23)$$

$$\left[ 20\binom{2}{1} + 10\binom{3}{1} \right] x +$$

$$\left[ 10\binom{3}{2} \right] x^2 \bmod 40$$

$$= 27 + 30x + 30x^2 \bmod 40$$

$$P_1^2(x) = \left[ 30\binom{1}{0} + 30\binom{2}{0} \right] + \left[ 30\binom{2}{1} \right] x \bmod 40 \quad (24)$$

$$= 20 + 20x \bmod 40$$

$$P_0^1(x) = \left[ 20\binom{1}{0} \right] \bmod 40 = 20. \quad (25)$$

As described above, to compute $P_3(x)$ in forward order with the hardware of FIG. 6, the registers are initialized as follows:
 (1) Register $P_5(x)$ is initialized to 0.
 (2) Register $P_4^5(x)$ is initialized to 27 (the constant term of the $P_2^3(x)$ polynomial).
 (3) Register $P_3^4(x)$ is initialized to 20 (the constant term of the $P_1^2(x)$ polynomial).
 (4) Register $P_2^3(x)$ is initialized to 20 (the constant term $P_0^1(x)$).
 (5) Registers $P_1^2(x)$ and $P_0^1(x)$ are initialized to 0.

After initialization, the registers are clocked 39 times to generate all 40 addresses in the sequence. Table 2 lists the contents of the registers as a function of the cycle number x for the polynomial $P_3(x) = 37x + 20x^2 + 10x^3 \bmod 40$ in forward order. It can be verified that the sequence of addresses in the $P_5(x)$ column of the table are the same as would be generated by direct computation of Equation (22).

The initial register values for the reverse order recursion, are found from the $Q_{i-1}^i(x)$ as follows.

$$Q_2^3(x) = \left[-37\binom{1}{0} + 20\binom{2}{0} - 10\binom{3}{0}\right] + \left[-20\binom{2}{1} + 10\binom{3}{1}\right]x + \left[-10\binom{3}{2}\right]x^2 \bmod 40 \quad (26)$$

$$= 13 + 30x + 10x^2 \bmod 40$$

$$Q_1^2(x) = \left[-30\binom{1}{0} + 10\binom{2}{0}\right] + \left[-30\binom{2}{1}\right]x \bmod 40 \quad (27)$$

$$= 20 + 20x \bmod 40$$

$$Q_0^1(x) = \left[-20\binom{1}{0}\right] \bmod 40 = 20 \quad (28)$$

Thus, to compute $P_3(x)$ in reverse order with the hardware of FIG. 6, the registers are initialized as follows:
(1) Register $P_5(x)$ is initialized to 0.
(2) Register $P_4^5(x)$ is initialized to 13 (the constant term of the $Q_2^3(x)$ polynomial).
(3) Register $P_3^4(x)$ is initialized to 20 (the constant term of the $Q_1^2(x)$ polynomial).
(4) Register $P_2^3(x)$ is initialed to 20 (the constant term $Q_0^1(x)$).
(5) Registers $P_1^2(x)$ and $P_0^1(x)$ are initialized to 0.

After initialization, the registers are clocked 40 times to generate all 40 addresses in the sequence. Table 3 lists the contents of the registers as a function of the cycle number x for the polynomial $P_3(x)=37x+20x^2+10x^3$ mod 40 in reverse order. Visual inspection reveals that the sequence in Table 3 is the reverse sequence of Table 2.

TABLE 2

| | x | $P_5(x)$ | $P_4^5(x)$ | $P_3^4(x)$ | $P_2^3(x)$ | $P_1^2(x)$ | $P_0^1(x)$ |
|---|---|---|---|---|---|---|---|
| initial values | 0 | 0 | 27 | 20 | 20 | 0 | 0 |
| | 1 | 27 | 7 | 0 | 20 | 0 | 0 |
| | 2 | 34 | 7 | 20 | 20 | 0 | 0 |
| | 3 | 1 | 27 | 0 | 20 | 0 | 0 |
| | 4 | 28 | 27 | 20 | 20 | 0 | 0 |
| | 5 | 15 | 7 | 0 | 20 | 0 | 0 |
| | 6 | 22 | 7 | 20 | 20 | 0 | 0 |
| | 7 | 29 | 27 | 0 | 20 | 0 | 0 |
| | 8 | 16 | 27 | 20 | 20 | 0 | 0 |
| | 9 | 3 | 7 | 0 | 20 | 0 | 0 |
| | 10 | 10 | 7 | 20 | 20 | 0 | 0 |
| | 11 | 17 | 27 | 0 | 20 | 0 | 0 |
| | 12 | 4 | 27 | 20 | 20 | 0 | 0 |
| | 13 | 31 | 7 | 0 | 20 | 0 | 0 |
| | 14 | 38 | 7 | 20 | 20 | 0 | 0 |
| | 15 | 5 | 27 | 0 | 20 | 0 | 0 |
| | 16 | 32 | 27 | 20 | 20 | 0 | 0 |
| | 17 | 19 | 7 | 0 | 20 | 0 | 0 |
| | 18 | 26 | 7 | 20 | 20 | 0 | 0 |
| | 19 | 33 | 27 | 0 | 20 | 0 | 0 |
| | 20 | 20 | 27 | 20 | 20 | 0 | 0 |
| | 21 | 7 | 7 | 0 | 20 | 0 | 0 |
| | 22 | 14 | 7 | 20 | 20 | 0 | 0 |
| | 23 | 21 | 27 | 0 | 20 | 0 | 0 |
| | 24 | 8 | 27 | 20 | 20 | 0 | 0 |
| | 25 | 35 | 7 | 0 | 20 | 0 | 0 |
| | 26 | 2 | 7 | 20 | 20 | 0 | 0 |
| | 27 | 9 | 27 | 0 | 20 | 0 | 0 |
| | 28 | 36 | 27 | 20 | 20 | 0 | 0 |
| | 29 | 23 | 7 | 0 | 20 | 0 | 0 |
| | 30 | 30 | 7 | 20 | 20 | 0 | 0 |
| | 31 | 37 | 27 | 0 | 20 | 0 | 0 |
| | 32 | 24 | 27 | 20 | 20 | 0 | 0 |
| | 33 | 11 | 7 | 0 | 20 | 0 | 0 |
| | 34 | 18 | 7 | 20 | 20 | 0 | 0 |
| | 35 | 25 | 27 | 0 | 20 | 0 | 0 |
| | 36 | 12 | 27 | 20 | 20 | 0 | 0 |
| | 37 | 39 | 7 | 0 | 20 | 0 | 0 |
| | 38 | 6 | 7 | 20 | 20 | 0 | 0 |
| | 39 | 13 | 27 | 0 | 20 | 0 | 0 |

TABLE 3

| | x | $P_5(x)$ | $P_4^5(x)$ | $P_3^4(x)$ | $P_2^3(x)$ | $P_1^2(x)$ | $P_0^1(x)$ |
|---|---|---|---|---|---|---|---|
| initial values | 0 | 0 | 13 | 20 | 20 | 0 | 0 |
| | 1 | 13 | 33 | 0 | 20 | 0 | 0 |
| | 2 | 6 | 33 | 20 | 20 | 0 | 0 |
| | 3 | 39 | 13 | 0 | 20 | 0 | 0 |
| | 4 | 12 | 13 | 20 | 20 | 0 | 0 |
| | 5 | 25 | 33 | 0 | 20 | 0 | 0 |
| | 6 | 18 | 33 | 20 | 20 | 0 | 0 |
| | 7 | 11 | 13 | 0 | 20 | 0 | 0 |
| | 8 | 24 | 13 | 20 | 20 | 0 | 0 |
| | 9 | 37 | 33 | 0 | 20 | 0 | 0 |
| | 10 | 30 | 33 | 20 | 20 | 0 | 0 |
| | 11 | 23 | 13 | 0 | 20 | 0 | 0 |
| | 12 | 36 | 13 | 20 | 20 | 0 | 0 |
| | 13 | 9 | 33 | 0 | 20 | 0 | 0 |
| | 14 | 2 | 33 | 20 | 20 | 0 | 0 |
| | 15 | 35 | 13 | 0 | 20 | 0 | 0 |
| | 16 | 8 | 13 | 20 | 20 | 0 | 0 |
| | 17 | 21 | 33 | 0 | 20 | 0 | 0 |
| | 18 | 14 | 33 | 20 | 20 | 0 | 0 |
| | 19 | 7 | 13 | 0 | 20 | 0 | 0 |
| | 20 | 20 | 13 | 20 | 20 | 0 | 0 |
| | 21 | 33 | 33 | 0 | 20 | 0 | 0 |
| | 22 | 26 | 33 | 20 | 20 | 0 | 0 |
| | 23 | 19 | 13 | 0 | 20 | 0 | 0 |
| | 24 | 32 | 13 | 20 | 20 | 0 | 0 |
| | 25 | 5 | 33 | 0 | 20 | 0 | 0 |
| | 26 | 38 | 33 | 20 | 20 | 0 | 0 |
| | 27 | 31 | 13 | 0 | 20 | 0 | 0 |
| | 28 | 4 | 13 | 20 | 20 | 0 | 0 |
| | 29 | 17 | 33 | 0 | 20 | 0 | 0 |
| | 30 | 10 | 33 | 20 | 20 | 0 | 0 |
| | 31 | 3 | 13 | 0 | 20 | 0 | 0 |
| | 32 | 16 | 13 | 20 | 20 | 0 | 0 |
| | 33 | 29 | 33 | 0 | 20 | 0 | 0 |
| | 34 | 22 | 33 | 20 | 20 | 0 | 0 |
| | 35 | 15 | 13 | 0 | 20 | 0 | 0 |
| | 36 | 28 | 13 | 20 | 20 | 0 | 0 |
| | 37 | 1 | 33 | 0 | 20 | 0 | 0 |
| | 38 | 34 | 33 | 20 | 20 | 0 | 0 |
| | 39 | 27 | 13 | 0 | 20 | 0 | 0 |
| | 40 | 0 | 13 | 20 | 20 | 0 | 0 |

The previous concepts apply primarily to a radix-2 decoder, which processes one vector per clock cycle. In a code trellis description, each processor of a radix-2 multi-processor decoder processes one trellis step per clock cycle. Radix-4 decoding is a common technique to increase decoder throughput. In a code trellis description, each processor of a radix-4 multi-processor decoder processes two trellis steps per clock cycle. A radix-4 vectorized decoder therefore processes two vectors per clock cycle. One vector corresponds to even-numbered trellis steps while the other corresponds to odd-numbered trellis steps.

Figure 8:
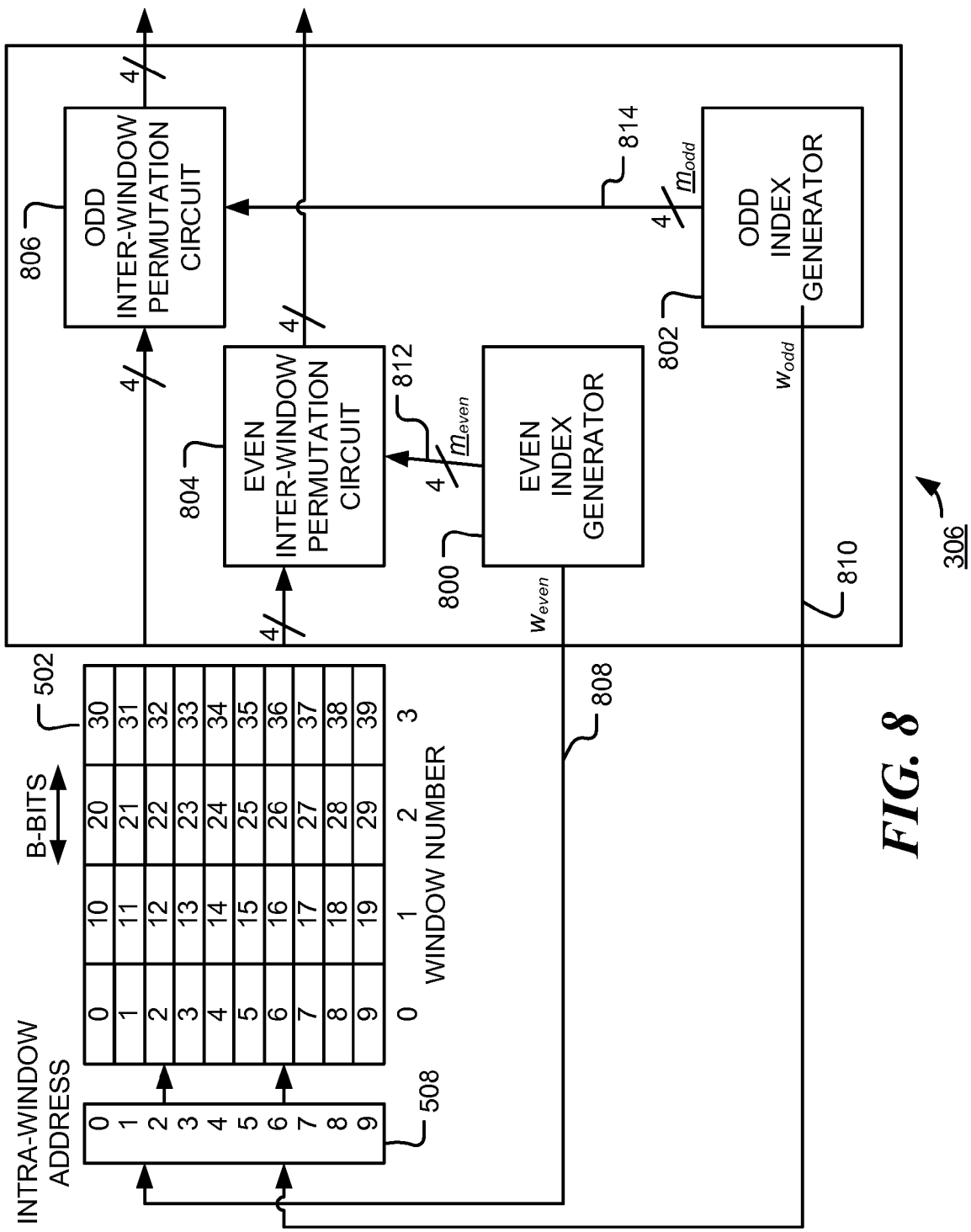
FIG. 8 is block diagram of an exemplary interleaver for a radix-4 turbo decoder in accordance with some embodiments of the invention.

FIG. 8 is a block diagram of an exemplary interleaver circuit, such as interleaver circuit 306, for a radix-4 decoder in accordance with some embodiments of the invention. Referring to FIG. 8, the interleaver circuit includes an even index generator 800, an odd index generator 802, an even inter-window permutation circuit 804 and an odd inter-window permutation circuit 806. The 10×4B memory 502 contains the 40 data samples of a block. In operation, the even index generator 800 generates an even intra-window index 808 that is passed to a memory access controller that causes the four data elements in the corresponding row of the memory 502 to be passed to the even inter-window permutation circuit 804. Likewise, the odd index generator 802 generates an odd intra-window index 810 that is passed to a memory access controller that causes the four data elements in the corresponding row of the memory 502 to be passed to the even inter-window permutation circuit 806. The index generators 800, 802 also generate a four-element permutation vector $\underline{m}_{even}$ 812 and a four-element permutation vector $\underline{m}_{odd}$ 814 that are passed to the even inter-window permutation circuit 804 and odd inter-window permutation circuit 806, respectively. The even and odd permutation circuits, 804 and 806 respectively, permute the order of the four data elements in accordance with the permutation vectors $\underline{m}_{even}$ and $\underline{m}_{odd}$, respectively, and outputs the data in permuted order to the processing elements of the decoder.

To effect radix-4 operation, the index generators 800 and 802 must advance by two steps on each clock cycle. Note that Equations (12) through (16) give the recursion formula for the forward advancement of the index generators by one step each clock cycle. Equations (17) through (21) give the recursion formula for the backward advancement by one step each clock cycle. These formulas are suitable for radix-2 processing.

For radix-4 processing these formulas are generalized as follows. The value of the recursion polynomial d steps away from step x is $$P_n(x+d) = \sum_{i=0}^{n} f_i(x+d)^i \quad (29)$$

$$= \sum_{i=0}^{n}\sum_{j=0}^{i} f_i \binom{i}{j} d^{i-j} x^j$$

$$= \sum_{i=0}^{n} f_i x^i + \sum_{i=0}^{n}\sum_{j=0}^{i-1} f_i \binom{i}{j} d^{i-j} x^j$$

$$= \sum_{i=0}^{n} f_i x^i + \sum_{i=0}^{n-1}\left(\sum_{j=i+1}^{n} f_j d^{j-i} \binom{j}{i}\right) x^i$$

$$= P_n(x) + S_{n-1}^n(x)$$

where $S_{n-1}^n(x)$ is an order n−1 polynomial $$S_{n-1}^n(x) = \sum_{i=0}^{n-1} S_{n-1,i} x^i \quad (30)$$

with coefficients $$S_{n-1,i} = \sum_{j=i+1}^{n} f_j d^{j-i}\binom{j}{i}. \quad (31)$$

Since $S_{n-1}^n(x)$ is itself a polynomial, we have $$S_{n-1}^n(x) = S_{n-1}^n(x+1) + S_{n-2}^{n-1}(x+1) \quad (32)$$

The recursion relation of Equation (32) can therefore be regressed back to the order-0 term as follows.

$$P_n(x+d) = P_n(x) + \sum_{i=0}^{n-1} S_{n-i-1}^{n-i}(x+i) \quad (33)$$

Equations (29) through (33) are the generalization of Equations (12) through (16) and (17) through (21). For radix-2 forward advancement d=1, while for radix-2 backward advancement d=−1. Likewise, for radix-4 forward advancement d=2, while for radix-4 backward advancement d=−2.

Figure 9:
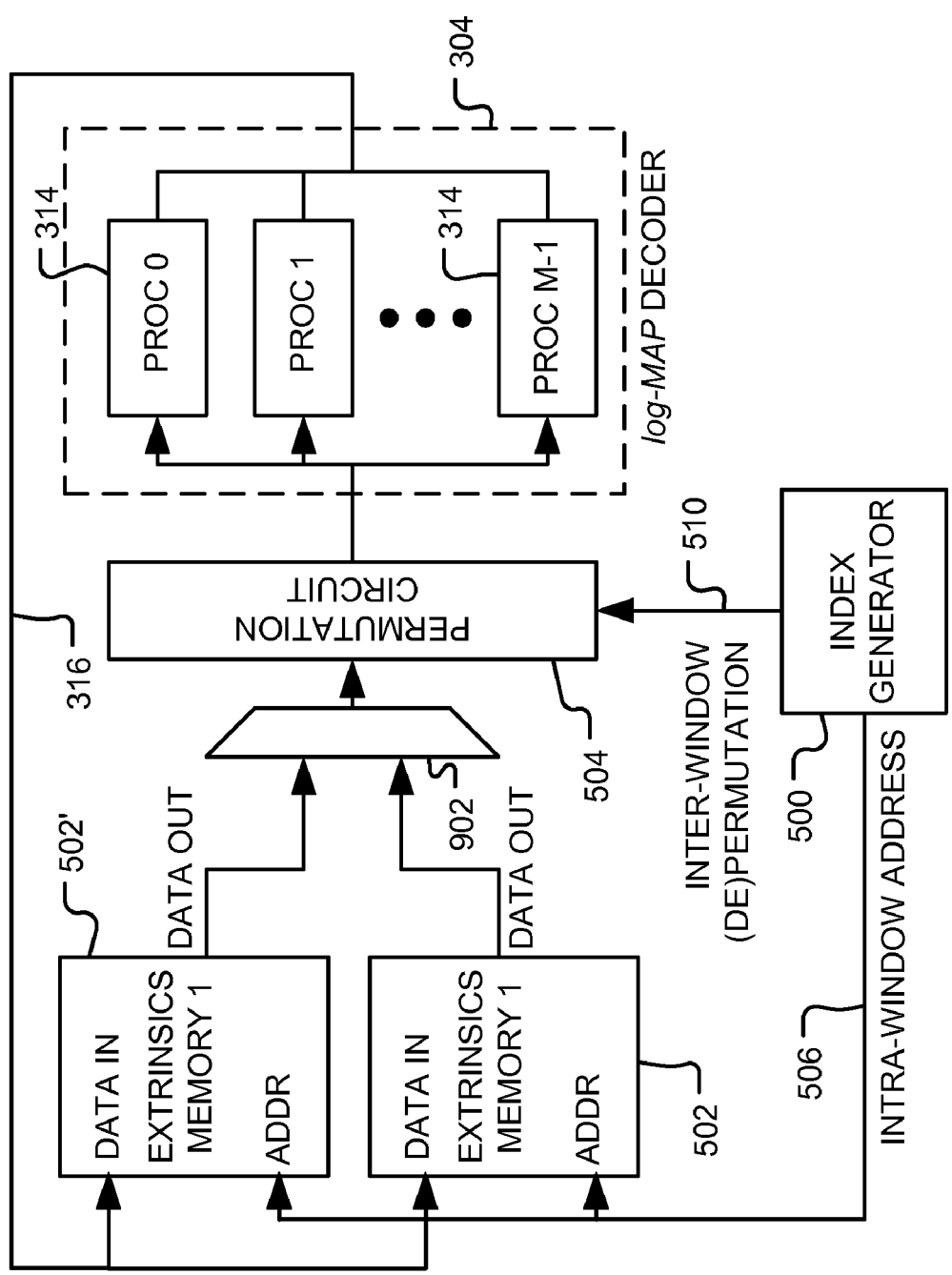
FIG. 9 is a block diagram of an exemplary turbo decoder circuit using a single permutation circuit in accordance with some embodiments of the invention.

FIG. 9 is a block diagram of an exemplary vectorized turbo decoder architecture. A log-MAP decoder, for example, decoder 304, is composed of multiple M log-MAP processors, such as processors 314 (labeled "PROC 0" through "PROC M−1"). The log-MAP decoder 304 alternates between decoder 1 mode (natural order processing) and decoder 2 mode (permuted order processing). There are also two memories, such as memory 502 and another memory 502', for extrinsic data storage, and a permutation circuit, such as permutation circuit 504. A memory selector 902 selects between the two memories, 502 and 502', depending on whether the log-MAP decoder 304 is in decoder 1 mode or decoder 2 mode. In either mode the interleaver, which comprises an index generator, such as index generator 500, and the permutation circuit 504, generates an intra-window address for extracting the data vector from a row of the memory and an inter-window permutation vector for permuting the data vector between the windows. Note that this architecture also enables radix-4 processing, where the index generator generates two address (even and odd) for extracting two data vectors from two rows of the memory in addition to two inter-window permutation vectors for permuting these data vectors between the windows.

FIGS. 10 and 11 illustrate the extrinsics memories' storage arrangements for a length-K block, K=MW. The extrinsics memories are W locations deep, and each location stores a length-M vector of B-bit quantities. Each small box in the diagrams of FIGS. 10 and 11 displays the index of the datum it contains. The interleaver permutation is denoted by π(x), 0≦x≦MW−1. FIG. 10 shows that extrinsics memory 1 (502') stores the data in permuted order. FIG. 11 shows that the extrinsics memory 2 (502) stores the data in natural order.

The flow of data in this architecture is as follows. In decoder 2 mode (permuted order processing), extrinsics are fetched vectorially from extrinsics memory 2 (the natural order memory) by issuing intra-window permutation addresses along with inter-window permutation vectors to control the permutation circuit. As the log-MAP processors generate updated extrinsics, decoder 2 stores them (as vectors) sequentially in extrinsics memory 1. Since decoder 2 generates updated extrinsics in permuted order but stores them sequentially, the extrinsics end up in extrinsics memory 1 in permuted order, as shown in FIG. 10.

In decoder 1 mode (natural order processing), extrinsics are fetched vectorially from extrinsics memory 1 (the permuted order memory). Since the data are in permuted order in the memory but decoder 1 processes in natural order, the extrinsics must be de-permuted as they are fetched. As discussed above, the inverse QPP permutation is vectorizable. Therefore, in the same fashion that decoder 2 permutes natural order extrinsics into permuted order extrinsics, decoder 1 de-permutes permuted order extrinsics into natural order extrinsics. Decoder 1 therefore issues an inter-window de-permutation address along with an inter-window de-permutation to control the permutation circuit.

The permutation circuit in the decoder architecture of FIG. 9 should be capable of arbitrary permutations. Thus, an M×M crossbar switch for B-bit values must be used. For LTE, throughput requirements may dictate M values as large as 32, and B is approximately 8 bits. A 32×32 crossbar switch for 8-bit values could be realized with 8192 2-input multiplexers. Therefore, the permutation circuit is a non-trivial aspect of the decoder. A single permutation circuit in the decoder architecture of FIG. 9 is possible because the interleaver permutation and its inverse permutation may both be vectorized.

When a permutation can be vectorized its inverse can also be vectorized (as described above). However, a contention-free permutation does not imply a contention-free inverse permutation. Consider the permutation $\pi(x)$, $0 \leq x \leq 7$, and its inverse $\pi^{-1}(x)$ tabulated in Table 4. The permutation $\pi(x)$ is clearly contention-free for M=2 (i.e., W=4). However, it is also clear that the inverse $\pi^{-1}(x)$ is not contention-free for M=2. For instance, $$\left\lfloor \frac{\pi^{-1}(0)}{4} \right\rfloor = 0 \qquad (34)$$

and $$\left\lfloor \frac{\pi^{-1}(4)}{4} \right\rfloor = 0 \qquad (35)$$

In fact, in the case there is a contention on every step.

TABLE 4

| x | $\pi(x)$ | $\pi^{-1}(x)$ |
|---|---|---|
| 0 | 0 | 0 |
| 1 | 6 | 5 |
| 2 | 2 | 2 |
| 3 | 4 | 7 |
| 4 | 5 | 3 |
| 5 | 1 | 4 |
| 6 | 7 | 1 |
| 7 | 3 | 6 |

Figure 12:
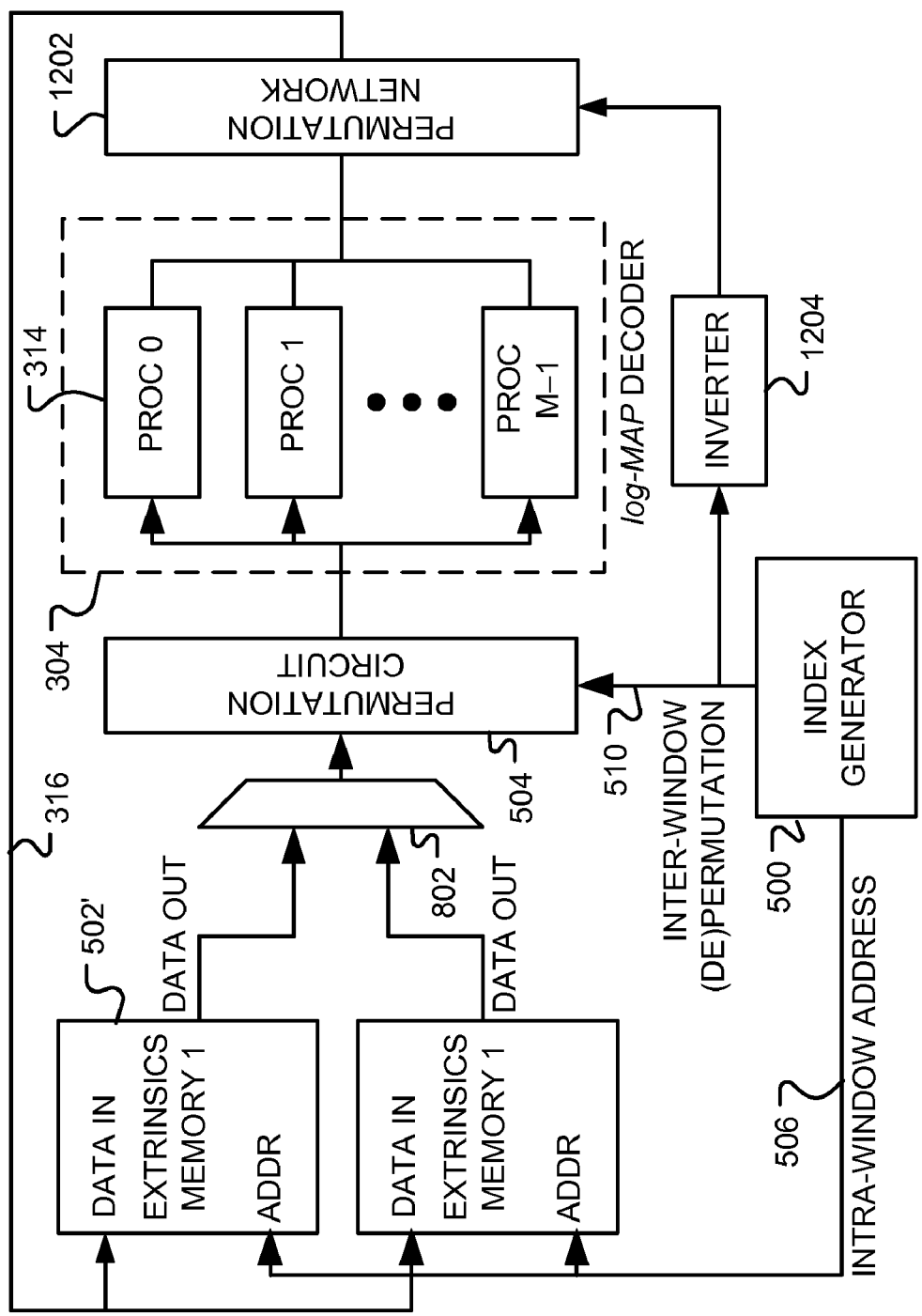
FIG. 12 is a block diagram of an exemplary turbo decoder circuit using two permutation circuits in accordance with some embodiments of the invention.

When the interleaver inverse permutation is not contention-free the decoder must store extrinsics in natural order in both extrinsics memories, necessitating the architecture shown in FIG. 12. FIG. 12 shows an exemplary turbo decoder architecture when the interleaver inverse permutation is not contention-free. This architecture has two permutation circuits 504 and 1202. The permutation circuit 504 permutes the extrinsics on fetch and the permutation circuit 1202 de-permutes the extrinsics on store. In addition, an inverter 1204 is needed to invert the inter-window permutation to drive the permutation circuit 1202. The decoder shown in FIG. 9 is thus simpler than the decoder shown in FIG. 12. As discussed above, when a vectorizable interleaver permutation like the QPP is used, only a single permutation network is required, and there is no need for hardware to invert the inter-window permutation.

The following capabilities for the interleaver module for the simpler decoder architecture of FIG. 9 are deduced.

(1) The interleaver module should be capable of generating both the permutation and its inverse. Furthermore, the module should be able to generate these permutations both in forward order and in reverse order. This requires a generic logic circuit to compute permutation polynomials recursively. The logic circuit needs to be designed for some maximum order, which for LTE will be 4 or 5.

(2) The interleaver module should be capable of decomposing M addresses into an intra-window address and an inter-window permutation at a rate of one per clock cycle. The logic circuit needs to be designed to accommodate some maximum number of windows $M_{max}$ and some maximum window size $W_{max}$. For LTE $M_{max}=16$ or $M_{max}=32$ and $W_{max}=384$ or $W_{max}=192$.

Consider a vectorized turbo decoder with M parallel processors operating on length-W windows. For permuted order processing, on the i-th step, $0 \leq i \leq W-1$, data at addresses $$\pi(i) = m_0 W + w_i \qquad (36)$$
$$\pi(i + W) = m_1 W + w_i$$
$$\pi(i + 2W) = m_2 W + w_i$$
$$\vdots$$
$$\pi(i + (M-1)W) = m_{M-1} W + w_i$$

must be fetched. The quantity $w_i$, $0 \leq w_i \leq W-1$, is the intra-window address and $$m = (m_0, m_1, m_2, \ldots, m_{M-1}) \qquad (37)$$

where $0 \leq m_i \leq M-1$ is the inter-window permutation.

Equations (36) show that the hardware must decompose an address $\pi(x) = m_x W + w_x$ into its components $m_x$ and $w_x$, where $$m_x = \left\lfloor \frac{\pi(x)}{W} \right\rfloor \qquad (38)$$

and $$w_x = \pi(x) \bmod W. \qquad (39)$$

One approach to this problem is to compute $\pi(x)$ and then follow this by hardware for a brute force computation of Equations (38) and (39). Unfortunately, this approach becomes expensive as M increases.

Figure 13:
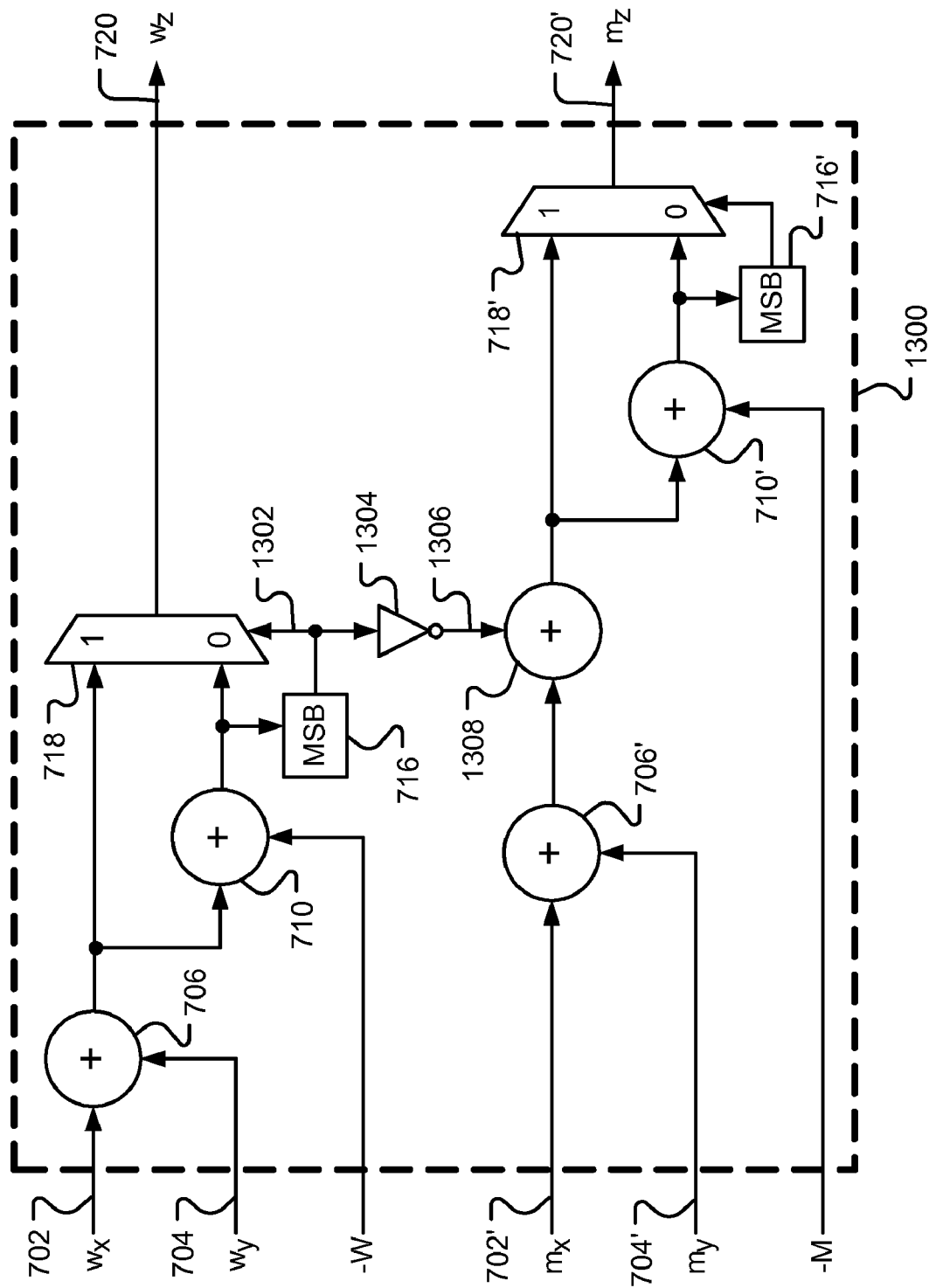
FIG. 13 is a block diagram of an exemplary base-W adder in accordance with some embodiments of the invention.

A better solution is to perform all computations involved in determining $\pi(x)$ in the "base-W" domain. With this solution, each quantity $v = m_v W + w_v$ involved in the computation of $\pi(x)$ is represented not as v, but as the pair $(m_v, w_v)$. All operations are performed on pairs, and the results are represented as pairs. For the recursive address generation hardware presented in FIG. 6, the renormalizable adders of FIG. 7 are replaced by the pair-based adders shown in FIG. 13. FIG. 13 shows an exemplary pair-based adder 1300 for the recursive address generation hardware of FIG. 6. Referring to FIG. 13, the pair-based adder 1300 adds a signal pair $(m_x, w_x)$ (702 and 702') to a signal pair $(m_y, w_y)$ (704 and 704'), resulting in the signal pair $(m_z, w_z)$ (720 and 720'). Note that the result is renormalized such that $0 \leq m_z \leq M-1$ and $0 \leq w_z \leq W-1$. Adder 706, adder 710, MSB selector 716, and signal selector 718 form a first renormalizable adder which adds $w_x$ and $w_y$ modulo L, where L=W, as described above with reference to FIG. 7. Similarly, a second renormalizable adder, comprising an adder 706' coupled to an adder 1308, an adder 710' coupled to adder 1308, an MSB selector 716' coupled to adder 710', and a signal selector 718' coupled to MSB selector 716' and adders 706' and 710', adds $m_x$, $m_y$, and a 'carry' signal 1306 modulo L, where L=M. A signal 1302 is output by MSB selector 716 if $w_x+w_y-W$ is negative. This signal is passed through an inverter 1304 to produce a 'carry' signal 1306 which is set if $w_x+w_y$ is $\geq W$. The carry signal 1306 is added to the output of adder 706' in adder 1308. Thus, all computations may be performed modulo W, rather than modulo K. When pair-based adders are used in the recursion circuit of FIG. 6, the intra-window addresses and inter-window permutation vector element are computed directly, rather than the brute force technique of computing an address and following this by subsequent computations to decompose the address into its w and m components.

With this solution, when an address $\pi(x)$ is computed the result will automatically appear in its decomposed form ($m_x$, $w_x$), where $$(m_x, w_x) = \left(\left\lfloor \frac{\pi(x)}{W} \right\rfloor, \pi(x) \bmod W\right). \tag{40}$$

Figure 14:
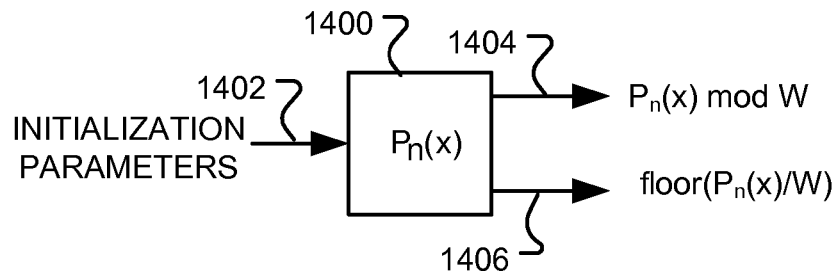
FIG. 14 is a block diagram of an exemplary base-W polynomial recursion circuit in accordance with some embodiments of the invention.

A polynomial recursion circuit 1400 for $P_n(x)$ with base-W adders is shown in FIG. 14. The circuit 1400 for $P_n(x)$ is configured with base-W adders. The circuit accepts a set of initialization parameters 1402 (to initialize the registers discussed above) and generates the component pair ($m_x$, $w_x$), respectively corresponding to outputs 1406 and 1404, defined in Equation (40).

The previous section described how the polynomial recursion circuit for $P_n(x)$ could be modified such that the each address is automatically decomposed into its m and w components. A vectorized turbo decoder actually needs M simultaneous decompositions for the M windows as in Equations (24). Note that with a vectorizable permutation the w component for all M windows will be identical, while the collection of m components will form the inter-window permutation.

Figure 15:
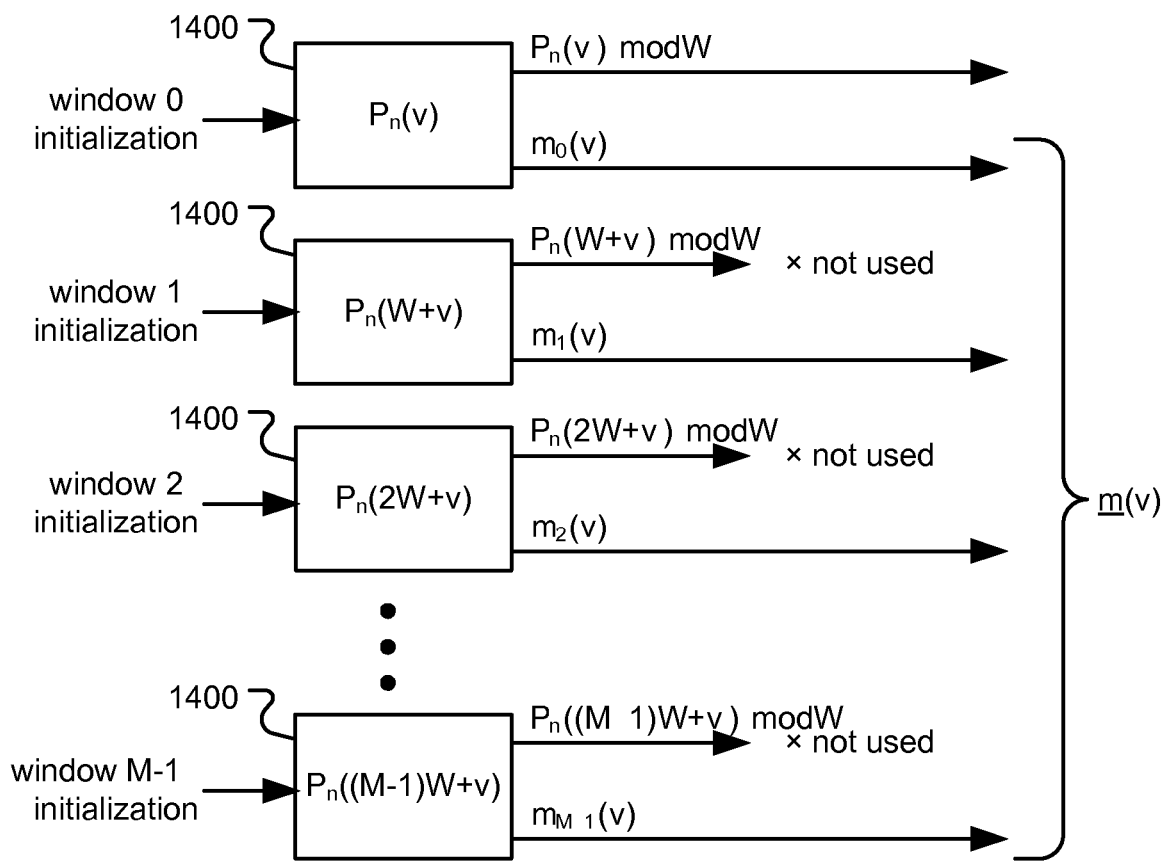
FIG. 15 is a block diagram of a direct form index generator using base-W polynomial recursion circuits in accordance with some embodiments of the invention.

In the indirect approach to the M simultaneous decompositions, M identical $P_n(x)$ circuits are instantiated, as shown in FIG. 15. FIG. 15 shows an example of an indirect approach for decomposing the interleaver into an intra-window address and inter-window permutation. The recursion circuits 1400 are initialized to start in staggered fashion at intervals of the window size W throughout the sequence. Specifically, the u-th circuit, $0 \leq u \leq M-1$, is initialized so that it starts at $P_n(uW)$. In this approach, the auto-decomposing form of $P_n(x)$ is used, so that the u-th circuit generates both $P_n(uW+v) \bmod W$ and floor $(P_n(uW+v)/W)=m_u(v)$. Since $P_n(uW+v) \bmod W$ is identical for all circuits only one of these outputs is actually employed. The set of $m_u(v)$ is collected to form the inter-window permutation.

In contrast to the indirect approach, the direct approach derives a recursion to compute the inter-window permutation directly as follows. The m component $m_u(v)$ of the u-th processor's address, $0 \leq u \leq M-1$, on the v-th step, $0 \leq v \leq W-1$, can be simplified as follows.

$$m_u(v) = \left\lfloor \frac{\sum_{i=0}^n f_i(uW+v)^i}{W} \right\rfloor \tag{41}$$

$$= \left\lfloor \frac{\sum_{i=0}^n f_i \sum_{j=0}^i \binom{i}{j} v^j u^{i-j} W^{i-j}}{W} \right\rfloor$$

$$= \left\lfloor \frac{\sum_{i=0}^n f_i v^i}{W} \right\rfloor + \sum_{i=0}^n f_i \sum_{j=0}^{i-1} \binom{i}{j} v^j u^{i-j} W^{i-j-1} \bmod M$$

$$= m_0(v) + \sum_{i=0}^{n-1} v^i \sum_{j=i+1}^n \binom{j}{j-i} f_j u^{j-i} W^{j-i-1} \bmod M$$

$$= m_0(v) + R_u(v)$$

where $R_u(v)$ is the order n-1 polynomial $$R_u(v) = \sum_{i=0}^{n-1} r_{u,i} v^i \bmod M \tag{42}$$

with coefficients $$r_{u,i} = \sum_{j=i+1}^n \binom{j}{j-i} f_j u^{j-i} W^{j-i-1} \bmod M. \tag{43}$$

Note that since $R_u(v)$ is a polynomial it can be computed recursively with the recursive structure depicted in FIG. 6. When the structure depicted in FIG. 6 is used to recursively compute $R_u(v)$ the computations can be reduced modulo M. Therefore, in this case the renormalizable adders of FIG. 7 can be used where K is replaced by M.

Figure 16:
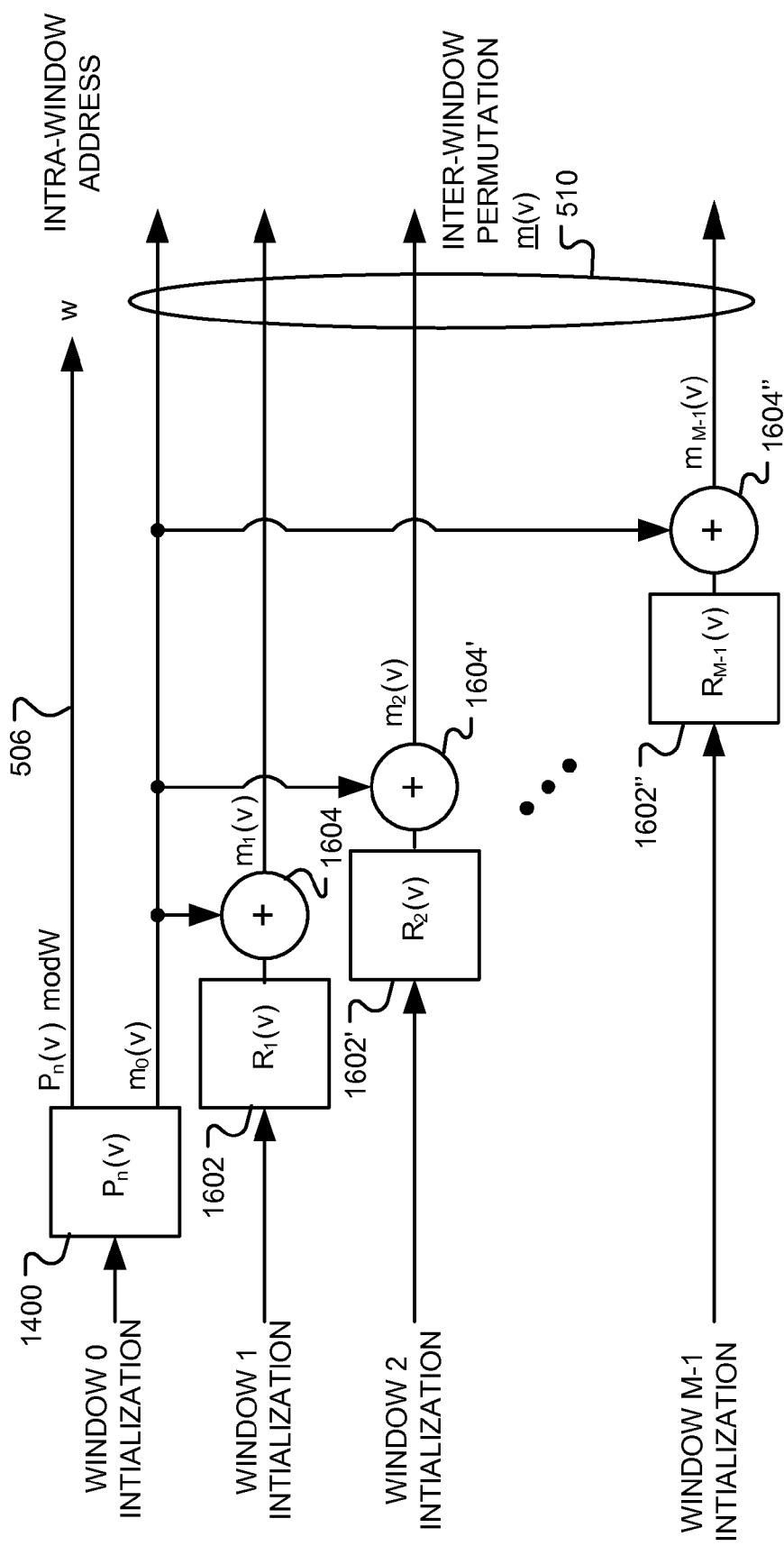
FIG. 16 is a block diagram of an indirect form index generator using base-W polynomial recursion circuits in accordance with some embodiments of the invention.

The last equation of the five equations of Equations (41) has the straightforward hardware interpretation shown in FIG. 16. FIG. 16 shows that a single instance 1400 of the auto-decomposing recursion circuit for $P_n(v)$, initialized to start at the beginning of the permutation sequence, is used to extract the intra-window address and the $m_0(v)$ term of the inter-window permutation. There are also M-1 instances (1602, 1602', and 1602") of a circuit to compute $R_u(v)$, $1 \leq u \leq M-1$, $0 \leq v \leq W-1$. According to the recipe in Equations (41), $m_0(v)$ is added, in adders 1604, 1604', and 1604", to each output $R_u(v)$ to obtain $m_u(v)$. Output 510 comprises a first output 1406 of the outputs of 1406, 1404 of auto-decomposing recursion circuit 1400 and the outputs of adders 1604, 1604', and 1604" and is the inter-window permutation vector $m(v)=(m_0(v), m_1(v), \ldots, m_{M-1}(v))$, and output 506, which is the intra-window index, w, comprises a second output 1404 of the outputs of 1406, 1404 of circuit 1400.

The inter-window permutation generation may be simplified using cyclic shifting. Under certain conditions, m(v) is a cyclic shift of m(0) for all v, $0 \leq v \leq W-1$. This would potentially help simplify the hardware to implement a permutation such as that shown in FIG. 4. To understand how this occurs, consider the permutation m(v). Since $m_0(v)$ is common to all elements of m(v), $$m(v) = (m_0(v), m_0(v) + R_1(v), \ldots, m_0(v) + R_{M-1}(v)) \bmod M \quad (44)$$

$$= m_0(v) + (0, R_1(v), \ldots, R_{M-1}(v)) \bmod M$$

$$= m_0(v) + R(v) \bmod M$$

Of particular interest is the case where the vector R(v) is constant and does not depend on v, namely $$R(v) = R(0) \quad (45)$$

hence implying that $$R_u(v) = r_{u,0} \quad (46)$$

for each u, $0 \leq u \leq M-1$. When this is the case, m(v) is a cyclic shift of R(0) by $m_0(v)$ positions.

Deriving from Equation (42), if the condition in Equation (46) is to hold for all u and W, it must be that $$\binom{j}{j-i} f_j \bmod M = 0 \quad (47)$$

for all $1 \leq i \leq n-1$ and $i+1 \leq j \leq n$. Since there are multiple possibilities of i for each value of j, it must be that $$\underset{1 \leq i \leq j-1}{LCD} \left[ \binom{j}{j-i} \right] f_j \bmod M = 0 \quad (48)$$

for $2 \leq j \leq n$ where $LCD_i[x_i]$ represents the lowest common divisor of all the numbers $x_i$.

In accordance with one aspect of the invention, a single logic circuit, properly initialized, serves to implement the QPP interleaver in a vectorized turbo decoder. The circuit may be capable of generating a sequence of QPP permutation indices or the sequence of inverse permutation indices. The circuit may compute these sequences in either forward or backward order. The circuit may comprise a single such circuit which advances one step per clock cycle for radix-2 processing. Furthermore, the circuit may comprise two such circuits, even and odd, each of which advances two step per clock cycle for radix-4 processing.

Vectorized permutations and vectorized turbo decoding architectures have been described above. In one embodiment, a single-permutation circuit decoder architecture is used when a permutation and its inverse are both vectorizable (as is the QPP permutation). The requirement for a vectorized turbo decoder interleaver to produce an intra-window address and an inter-window permutation was discussed and two solutions to the problem were presented. One (indirect) solution, shown in FIG. 15, instantiates a number of staggered full interleavers, while the other (direct) solution, shown in FIG. 16, relies on a recursion to compute the sequence of inter-window permutation directly. A criterion that could be used in the interleaver design phases (Equation (48)) was derived which turns the inter-window permutation sequence generation into a series of cyclic shifts.

All of the techniques derived here rely on the proper initialization of a set of registers. These initial values (the constant terms of Equations (14), (19), and (42)) may be pre-computed and stored in a read-only-memory or computed in real time.

Figure 17:
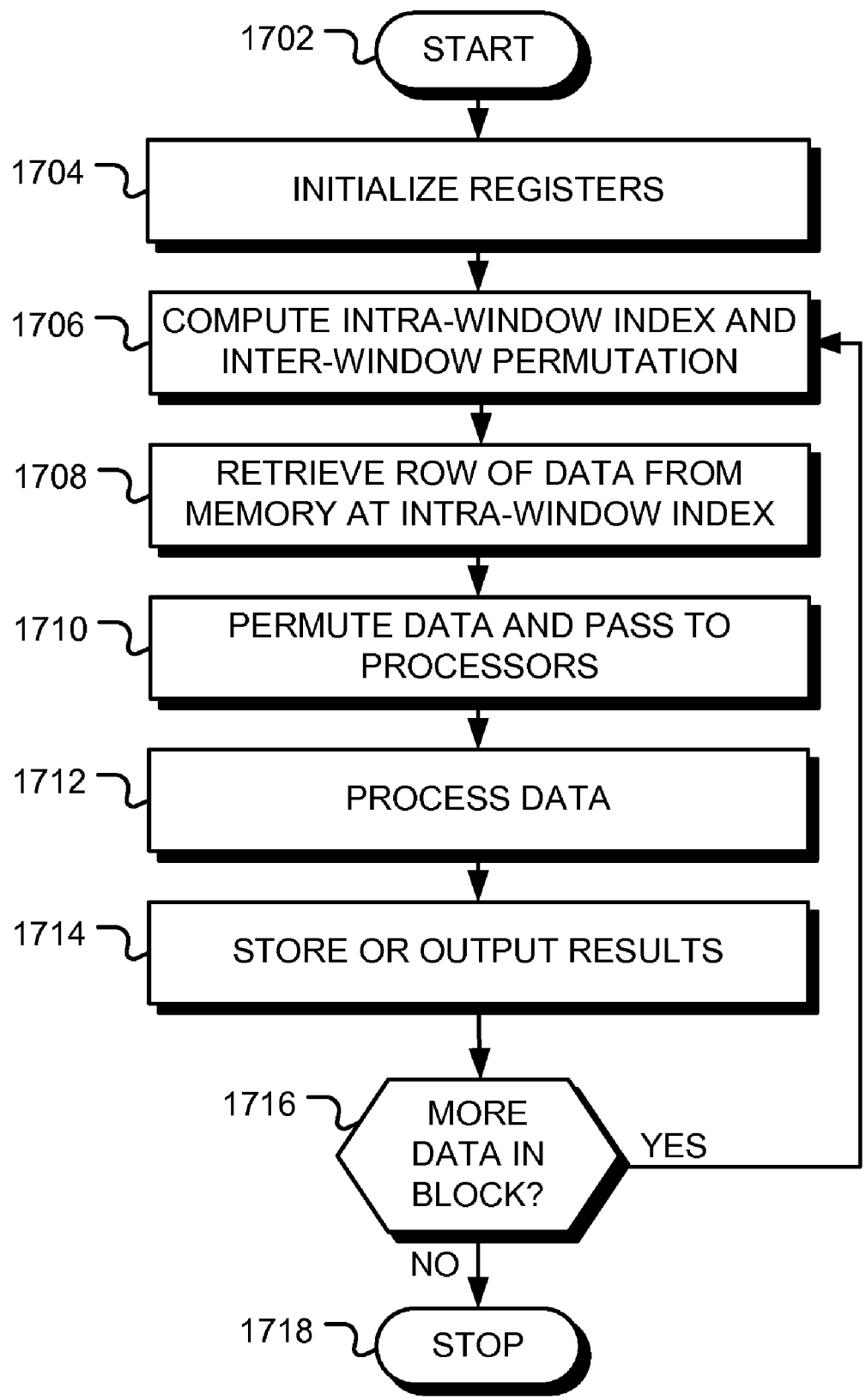
FIG. 17 is a flow chart of a method for accessing data values in interleaved order in accordance with some embodiments of the invention.

FIG. 17 is a flow chart of a method for vectorized processing of interleaved data consistent with certain aspects of the invention. Following start block 1702 in FIG. 17, the registers of a recursion circuit are initialized at block 1704. At block 1706, the recursion circuit is clocked to generate an intra-window index, w, and an inter-window permutation vector, m. At block 1708, the intra-window index, w, is used to retrieve a row of data from a memory. At block 1710, these data values are permuted and passed to the parallel processors. They may be processors of a turbo decoder, or they may perform some other process that utilizes interleaved or permuted data. The data is processed at block 1712 and at block 1714 the results of the processing may be stored in memory or output. If there are more data values to be processed in the current data block, as depicted by the positive branch from decision block 1716, flow returns to block 1706 and the next intra-window index and permutation vector are calculated. If there are no more data values to be processed in the current data block, as depicted by the negative branch from decision block 1716, the current block has been processed and the method terminates at block 1718.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The currently claimed invention is defined by the appended claims including any amendments made during the pendency of this application and all equivalents of those claims as issued.

What is claimed is:

1. A method for interleaving a block of data comprising M windows of W values according to a degree n permutation polynomial $P_n(x)$ of an index x in a signal processing system comprising M parallel processors, the method comprising:
   storing the block of data in an W×M array in a memory;
   for each index x in the range $0 \leq x < W$:
      generating an intra-window index w(x) and a first inter-window value m(x) for an index x a first window, where $P_n(x) = m(x)W + w(x)$;
      computing an inter-window permutation vector $\overline{m}$ of length M dependent upon the first inter-window value m(x);
      retrieving data values corresponding to the intra-window index w(x) from the memory;
      reordering the retrieved data values in accordance with the inter-window permutation vector $\overline{m}$ to produce reordered data values; and
   passing a reordered data value to each of the M parallel processors.

2. The method in accordance with claim 1, further comprising:
   generating M−1 parallel values according to M−1 degree n−1 polynomials $R_1(x), R_2(x), \ldots, R_{M-1}(x)$ recursively using a plurality of registers and renormalizable adders; and
   computing the inter-window permutation vector $\overline{m} = [m(x), m(x)+R_1(x), m(x)+R_2(x), \ldots, m(x)+R_{M-1}(x)]$ modulo M.

3. The method in accordance with claim 1, wherein computing an inter-window permutation vector $\overline{m}$ comprises computing M pairs of values $(w_0(x), m_0(x)), (w_1(x), m_1(x)), \ldots, (w_{M-1}(x), m_{M-1}(x))$, where $P_n(x+iW) = m_i(x)W + w_i$ (x), $0 \leq i \leq M-1$, and $w_0(x)=w_1(x)=\ldots=w_{M-1}(x)$ recursively, using a plurality of registers and pair-based adders, and where $\underline{m}=[m_0(x), m_1(x), \ldots, m_{M-1}(x)]$.

4. The method in accordance with claim 1, wherein the signal processing system comprises a turbo decoder and wherein generating the intra-window index w(x) and inter-window permutation vector $\underline{m}$ comprises:
  generating the intra-window index w(x) and inter-window permutation vector $\underline{m}$ for natural ordering processing when the signal processing system is in a first mode of operation; and
  generating the intra-window index w(x) and inter-window permutation vector $\underline{m}$ for interleaved ordering processing when the signal processing system is in a second mode of operation.

5. The method in accordance with claim 1, wherein the signal processing system comprises a turbo decoder and wherein generating the intra-window index w(x) and inter-window permutation vector $\underline{m}$ comprises:
  generating the intra-window index w(x) and inter-window permutation vector $\underline{m}$ for de-interleaving when the signal processing system is in a first mode of operation; and
  generating the intra-window index w(x) and inter-window permutation vector $\underline{m}$ for interleaved ordering processing when the signal processing system is in a second mode of operation.

6. A data interleaving circuit operable to interleave a block of data comprising M windows of W values according to a degree n permutation polynomial $P_n(x)$ of an index x in a signal processing system comprising M parallel processors, the circuit comprising:
  a memory configured to store the block of data in a W×M array in the memory;
  a first circuit configured to generate an intra-window index w(x) and a first inter-window index m(x) for an index x of a first window, where $P_n(x)=m(x)W+w(x)$;
  a second circuit configured to generate an inter-window permutation vector $\underline{m}$ of length M dependent upon the first inter-window value m(x);
  a memory access controller operable to receive the intra-window index w(x) and retrieve the corresponding data values from the memory; and
  a permutation circuit configured to receive the data values having intra-window index w(x) from the memory, reorder the data values in accordance with the inter-window permutation vector $\underline{m}$, and output the reordered data values to the M parallel processors.

7. The data interleaving circuit in accordance with claim 6, wherein the second circuit comprises:
  M-1 parallel circuits configured to generate M-1 parallel values according to M-1 degree n-1 polynomials $R_1(x)$, $R_2(x), \ldots, R_{M-1}(x)$; and
  M-1 parallel renormalizable adders configured to compute the inter-window permutation vector $\underline{m} = [m(x), m(x)+R_1(x), m(x)+R_2(x), \ldots, m(x)+R_{m-1}(x)]$ modulo M.

8. The data interleaving circuit in accordance with claim 7, wherein each of the M-1 parallel circuits comprises a plurality of registers and renormalizable adders, each renormalizable adder comprising:
  a first adder configured to add first and second input signals to produce a first summed signal as output;
  a second adder configured to add the first summed signal to a value (-M) to produce a second summed signal; and
  a signal selector configured to receive the first and second summed signals as inputs and to provide the first summed signal as output if the second summed signal is negative and to provide the second summed signal as output if the second summed signal is non-negative,
wherein the output of the signal selector is the addition modulo M of the first and second input signals.

9. The data interleaving circuit in accordance with claim 6, wherein the second circuit comprises:
  M circuits configured to generate M pairs of intra-window indices and inter-window values $(w_0(x),m_0(x)), (w_1(x), m_1(x)), \ldots, (w_{M-1}(x),m_{M-1}(x))$, where $P_n(x+iW)=m_i(x)W+w_i(x)$, $0 \leq i<M-1$, $w_0(x)=w_1(x)=\ldots=w_{M-1}(x)$, and x is an index in the range $0 \leq x<W$, and where $\underline{m} = [m_0(x),m_1(x), \ldots, m_{M-1}(x)]$.

10. The data interleaving circuit in accordance with claim 9, wherein the M circuits configured to generate M pairs of intra-window indices and inter-window values each comprise a plurality of registers and pair-based adders, and wherein each pair-based adder comprises:
  a first renormalizable adder for computation of the modulo W addition of two numbers $w_x$ and $w_y$;
  at least one logic circuit for computation of a carry signal that equals 1 when $w_x+w_y$ W and is 0 otherwise; and
  a second renormalizable adder for computation of the modulo M addition of $m_x$, $m_y$ and a carry signal.

11. The data interleaving circuit in accordance with claim 10, wherein each renormalizable adder further comprises:
  a first adder configured to add first and second input signals to produce a first summed signal as output;
  a second adder configured to add the first summed signal to a value (-L) to produce a second summed signal; and
  a signal selector configured to receive the first and second summed signals as inputs and to provide the first summed signal as output if the second summed signal is negative and to provide the second summed signal as output if the second summed signal is non-negative,
wherein the output of the signal selector is the addition modulo L of the first and second input signals.

12. The data interleaving circuit in accordance with claim 6, wherein the operations performed for each index x in the range $0 \leq x<W$ are performed on W consecutive clock cycles corresponding to incrementing x by 1 starting at 0 and increasing through W-1.

13. The data interleaving circuit in accordance with claim 6, wherein the operations performed for each index x in the range $0 \leq x<W$ are performed on W consecutive clock cycles corresponding to decrementing x by 1 starting at W-1 and decreasing through 0.

14. The data interleaving circuit in accordance with claim 6, wherein the operations performed for each index x in the range $0 \leq x<W$ are performed on W/2 consecutive clock cycles, where on the i-th clock cycle the operations are performed for indices 2i and 2i+1 and i is incremented by 1 starting at 0 and increasing through W/2-1 and where W is even.

15. The data interleaving circuit in accordance with claim 6, wherein the operations performed for each index x in the range $0 \leq x<W$ are performed on W/2 consecutive clock cycles, where on the i-th clock cycle the operations are performed for indices 2i and 2i+1 and i is decremented by 1 starting at W/2-1 and decreasing through 0 and where W is even.

16. The data interleaving circuit in accordance with claim 6, wherein the circuit configured to generate an intra-window value w(x) and an inter-window value m(x) for an index x of a first window, where $P_n(x)=m(x)W+w(x)$, comprises a plurality of registers and pair-based adders, each pair-based adder further comprising:

a first renormalizable adder configured to compute the modulo W addition of two numbers $w_x$ and $w_y$;

at least one logic circuit to compute a carry signal that equals 1 when $w_x + w_y \geq W$ and is 0 otherwise; and a second renormalizable adder configured to compute the modulo M addition of the three numbers $m_x$, $m_y$, and a carry signal.

17. The data interleaving circuit in accordance with claim 6, wherein the signal processing system comprises a turbo decoder and wherein the turbo decoder further comprises:

a first memory configured to store the data block in an interleaved order;

a second memory configured to store the data block in natural order; and a memory selector coupled between the first and second memories and the permutation circuit and operable to select between the first and second memories.

18. The data interleaving circuit in accordance with claim 6, configured to interleave the block of data according to a degree n permutation polynomial $P_n(x)$ when in a first mode of operation and according to the inverse of the permutation polynomial $P_n(x)$ when in a second mode of operation.

19. The data interleaving circuit in accordance with claim 6, wherein the signal processing system comprises a turbo decoder and wherein the turbo decoder further comprises:

two memories, each configured to store the data in natural order;

a memory selector coupled between the two memories and the permutation circuit and configured to select between the two memories;

an inverter circuit configured to compute the inverse permutation of the inter-window permutation $\underline{m}$; and a second permutation circuit configured to reorder processed data in accordance with the inverse of the inter-window permutation.

20. A programmable logic device configured to implement the data interleaving circuit in accordance with claim 6.

21. An application specific integrated circuit (ASIC) configured to implement the data interleaving circuit in accordance with claim 6.

* * * * *